United States Patent
Fan et al.

(10) Patent No.: US 11,742,244 B2
(45) Date of Patent: Aug. 29, 2023

(54) LEAKAGE REDUCTION METHODS AND STRUCTURES THEREOF

(71) Applicant: Taiwan Semiconductor Manufacturing Co., Ltd., Hsin-Chu (TW)

(72) Inventors: Chia-Sheng Fan, Hsinchu County (TW); Chun-Yen Lin, Hsinchu (TW); Tung-Heng Hsieh, Hsinchu County (TW); Bao-Ru Young, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 204 days.

(21) Appl. No.: 17/093,350

(22) Filed: Nov. 9, 2020

(65) Prior Publication Data
US 2021/0082769 A1 Mar. 18, 2021

Related U.S. Application Data

(63) Continuation of application No. 16/397,938, filed on Apr. 29, 2019, now Pat. No. 10,832,958, which is a
(Continued)

(51) Int. Cl.
*H01L 21/8234* (2006.01)
*H01L 29/66* (2006.01)
(Continued)

(52) U.S. Cl.
CPC ........ *H01L 21/823437* (2013.01); *H01L 21/823431* (2013.01); *H01L 29/6681* (2013.01);
(Continued)

(58) Field of Classification Search
CPC ......... H01L 29/66545; H01L 29/66795; H01L 29/785; H01L 29/6681; H01L 29/7851;
(Continued)

(56) References Cited

U.S. PATENT DOCUMENTS 8,796,666 B1   8/2014   Huang et al.
8,815,712 B2   8/2014   Wan et al.
(Continued)

FOREIGN PATENT DOCUMENTS

CN   103247678 A   8/2013
CN   105006483 A   10/2015
(Continued)

*Primary Examiner* — Jaehwan Oh
*Assistant Examiner* — John M Parker
(74) *Attorney, Agent, or Firm* — Haynes and Boone, LLP

(57) ABSTRACT

A method and structure for mitigating leakage current in devices that include a continuous active region. In some embodiments, a threshold voltage at the cell boundary is increased by changing a photomask logic operation (LOP) to reverse a threshold voltage type at the cell boundary. Alternatively, in some cases, the threshold voltage at the cell boundary is increased by performing a threshold voltage implant (e.g., an ion implant) at the cell boundary, and into a dummy gate disposed at the cell boundary. Further, in some embodiments, the threshold voltage at the cell boundary is increased by use of a silicon germanium (SiGe) channel at the cell boundary. In some cases, the SiGe may be disposed within the substrate at the cell boundary and/or the SiGe may be part of the dummy gate disposed at the cell boundary.

20 Claims, 13 Drawing Sheets

Related U.S. Application Data continuation of application No. 15/692,769, filed on Aug. 31, 2017, now Pat. No. 10,276,445.

(51) Int. Cl.
*H01L 27/12* (2006.01)
*H01L 21/84* (2006.01)
*H01L 27/088* (2006.01)
*H01L 29/78* (2006.01)

(52) U.S. Cl.
CPC ........ *H01L 21/845* (2013.01); *H01L 27/0886* (2013.01); *H01L 27/1211* (2013.01); *H01L 29/66795* (2013.01); *H01L 29/785* (2013.01); *H01L 29/7851* (2013.01)

(58) Field of Classification Search
CPC ..... H01L 21/823431; H01L 21/823437; H01L 27/0886
See application file for complete search history.

(56) References Cited

U.S. PATENT DOCUMENTS

| | | | |
|---|---|---|---|
| 8,963,258 B2 | 2/2015 | Yu et al. | |
| 9,053,283 B1 | 6/2015 | Chen et al. | |
| 9,093,530 B2 | 7/2015 | Huang et al. | |
| 9,171,929 B2 | 10/2015 | Lee et al. | |
| 9,214,555 B2 | 12/2015 | Oxland et al. | |
| 9,236,267 B2 | 1/2016 | De et al. | |
| 9,257,505 B2 | 2/2016 | Lai et al. | |
| 9,299,842 B2 | 3/2016 | Baek | |
| 9,385,236 B1 | 7/2016 | Sun et al. | |
| 9,425,201 B2 | 8/2016 | Liaw | |
| 9,455,331 B1 | 9/2016 | Cai et al. | |
| 9,520,482 B1 | 12/2016 | Chang et al. | |
| 9,548,303 B2 | 1/2017 | Lee et al. | |
| 9,576,814 B2 | 2/2017 | Wu et al. | |
| 9,653,466 B2 | 5/2017 | Yang et al. | |
| 9,685,440 B1 | 6/2017 | Cheng et al. | |
| 9,799,570 B1 | 10/2017 | Cheng | |
| 9,899,263 B2 | 2/2018 | Hsieh et al. | |
| 2003/0022474 A1* | 1/2003 | Grover | H01L 29/66143 257/E21.384 |
| 2007/0001237 A1 | 1/2007 | King et al. | |
| 2009/0253238 A1 | 10/2009 | Shi et al. | |
| 2010/0232212 A1 | 9/2010 | Anderson et al. | |
| 2012/0118854 A1 | 5/2012 | Smayling et al. | |
| 2013/0330889 A1 | 12/2013 | Yin et al. | |
| 2017/0040324 A1 | 2/2017 | Yang et al. | |
| 2017/0162569 A1* | 6/2017 | Campi, Jr. | H01L 29/66795 |
| 2017/0278928 A1 | 9/2017 | Tung | |
| 2017/0278947 A1 | 9/2017 | Feng et al. | |
| 2017/0338323 A1 | 11/2017 | Cheng et al. | |
| 2018/0019316 A1 | 1/2018 | Cheng et al. | |
| 2018/0019317 A1 | 1/2018 | Cheng et al. | |
| 2018/0040713 A1 | 2/2018 | Chang et al. | |
| 2018/0068901 A1 | 3/2018 | Cheng | |
| 2018/0082850 A1 | 3/2018 | Cheng et al. | |
| 2020/0066718 A1 | 2/2020 | Li et al. | |

FOREIGN PATENT DOCUMENTS

| | | |
|---|---|---|
| CN | 106298916 A | 1/2017 |
| KR | 20150128532 A | 11/2015 |
| TW | 201419451 A | 5/2014 |
| TW | 201610734 A | 3/2016 |

* cited by examiner

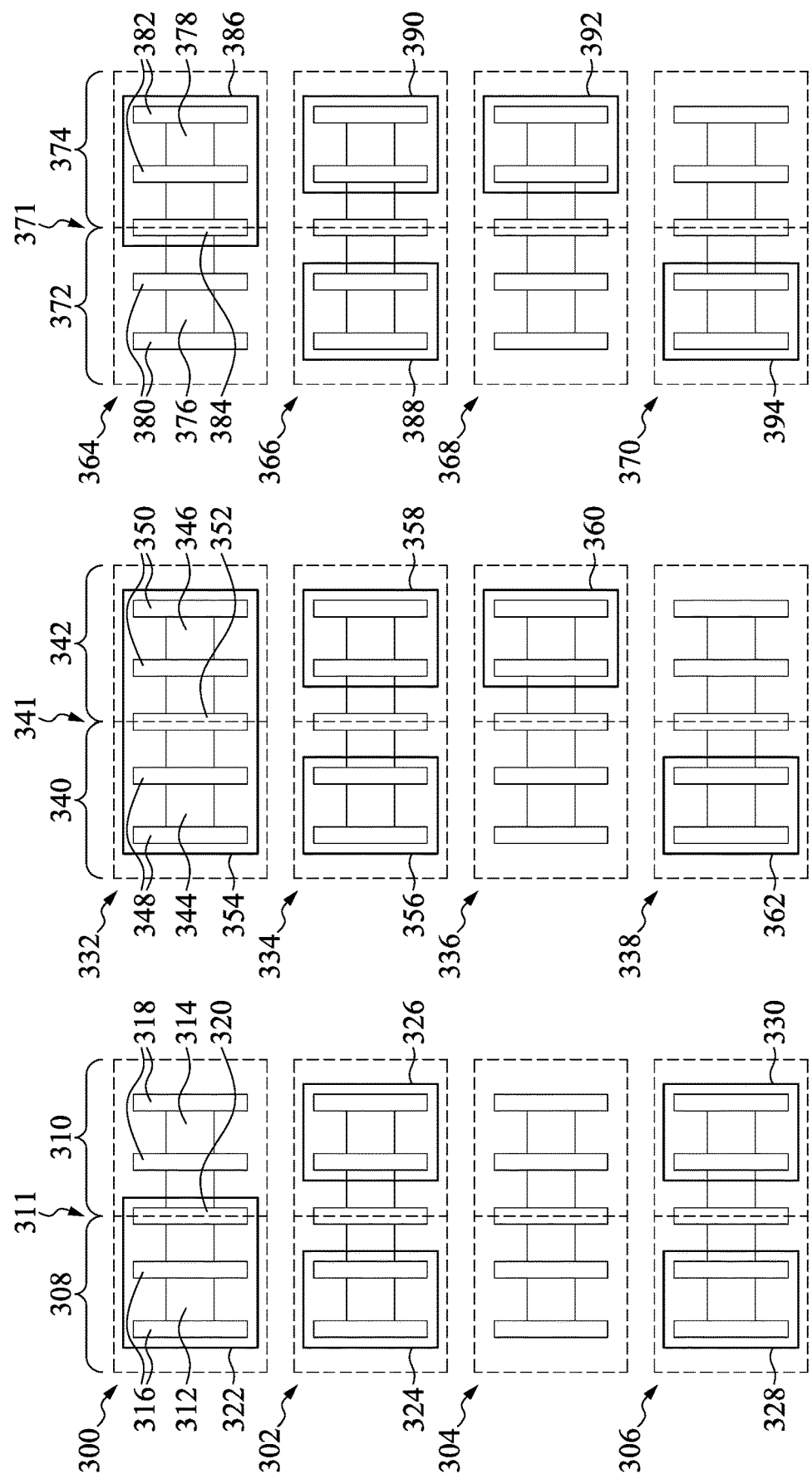

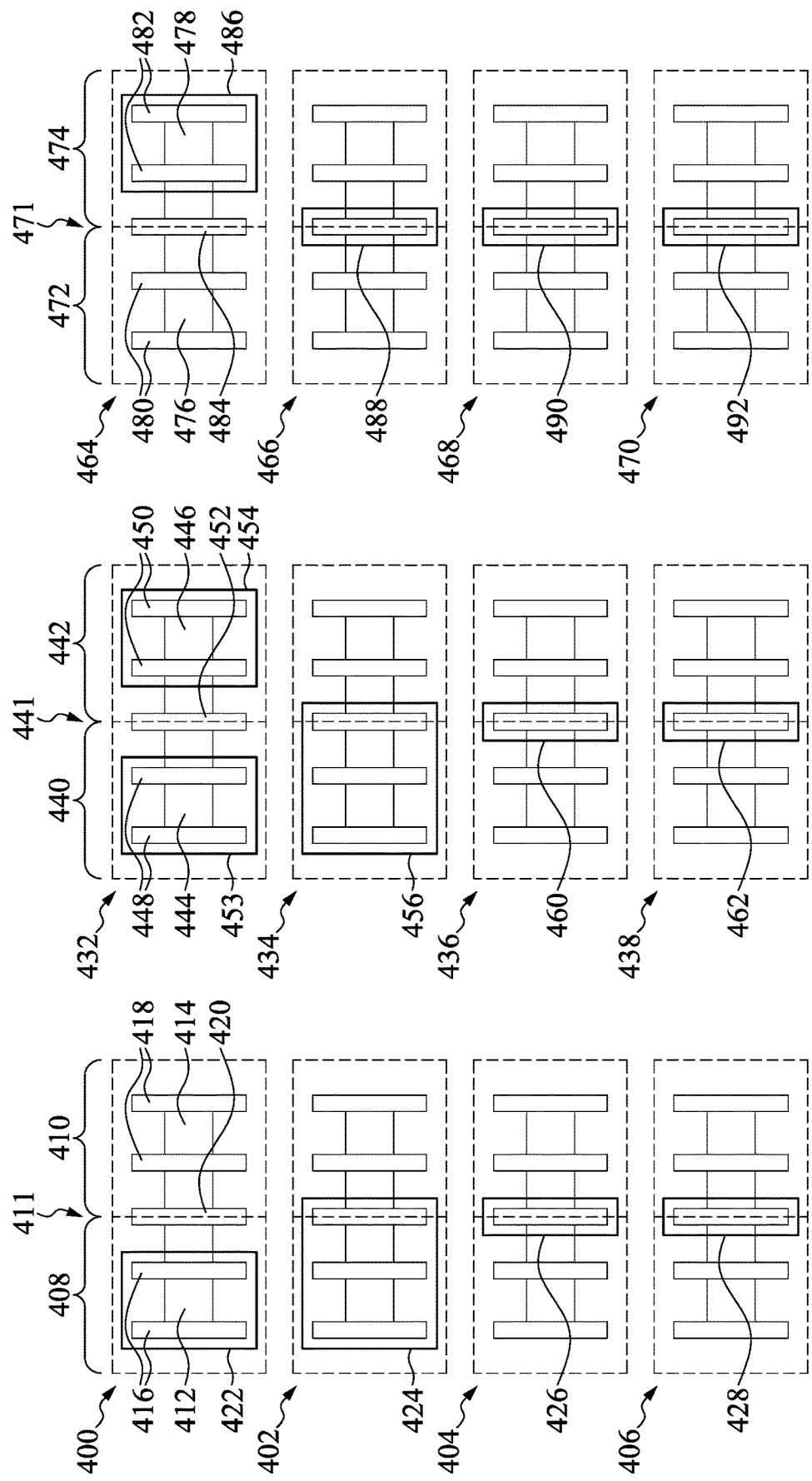

LEAKAGE REDUCTION METHODS AND STRUCTURES THEREOF

CROSS-REFERENCE TO RELATED APPLICATION

This application is a continuation application of U.S. patent applicant Ser. No. 16/397,938, filed Apr. 29, 2019, issuing as U.S. Pat. No. 10,832,958, which is a continuation application of U.S. patent application Ser. No. 15/692,769, filed Aug. 31, 2017, now U.S. Pat. No. 10,276,445, the disclosures of which are incorporated by reference herein in their entireties.

BACKGROUND

The electronics industry has experienced an ever increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the fin field-effect transistor (FinFET). The FinFET gets its name from the fin-like structure which extends from a substrate on which it is formed, and which is used to form the FET channel. FinFETs are compatible with conventional complementary metal-oxide-semiconductor (CMOS) processes and their three-dimensional structure allows them to be aggressively scaled while maintaining gate control and mitigating SCEs. In addition, at least one aspect of IC scaling has included reducing cell size (e.g., as part of a layout process). In some examples, reduction in FinFET cell size has included abutment of active regions, such as FinFET active regions, in neighboring cells. In some cases, active region abutment across neighboring cells may be referred to as a "continuous active region". In various examples, a continuous active region can lead to significant leakage current. In some cases, attempts have been made to reduce such leakage current by adding filler layers to enlarge a lithography window. However, use of such a filler layers will result in an area penalty (e.g., increase in area). Thus, existing techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A, 3B, and 3C, illustrate mask layout designs that may be used to set a work function of a metal gate for various pairs of neighboring N-type cells having a continuous active region, in accordance with some embodiments;

FIGS. 4A, 4B, and 4C, illustrate mask layout designs that may be used to set a work function of a metal gate for various pairs of neighboring P-type cells having a continuous active region, in accordance with some embodiments;

DETAILED DESCRIPTION

Figure 1:
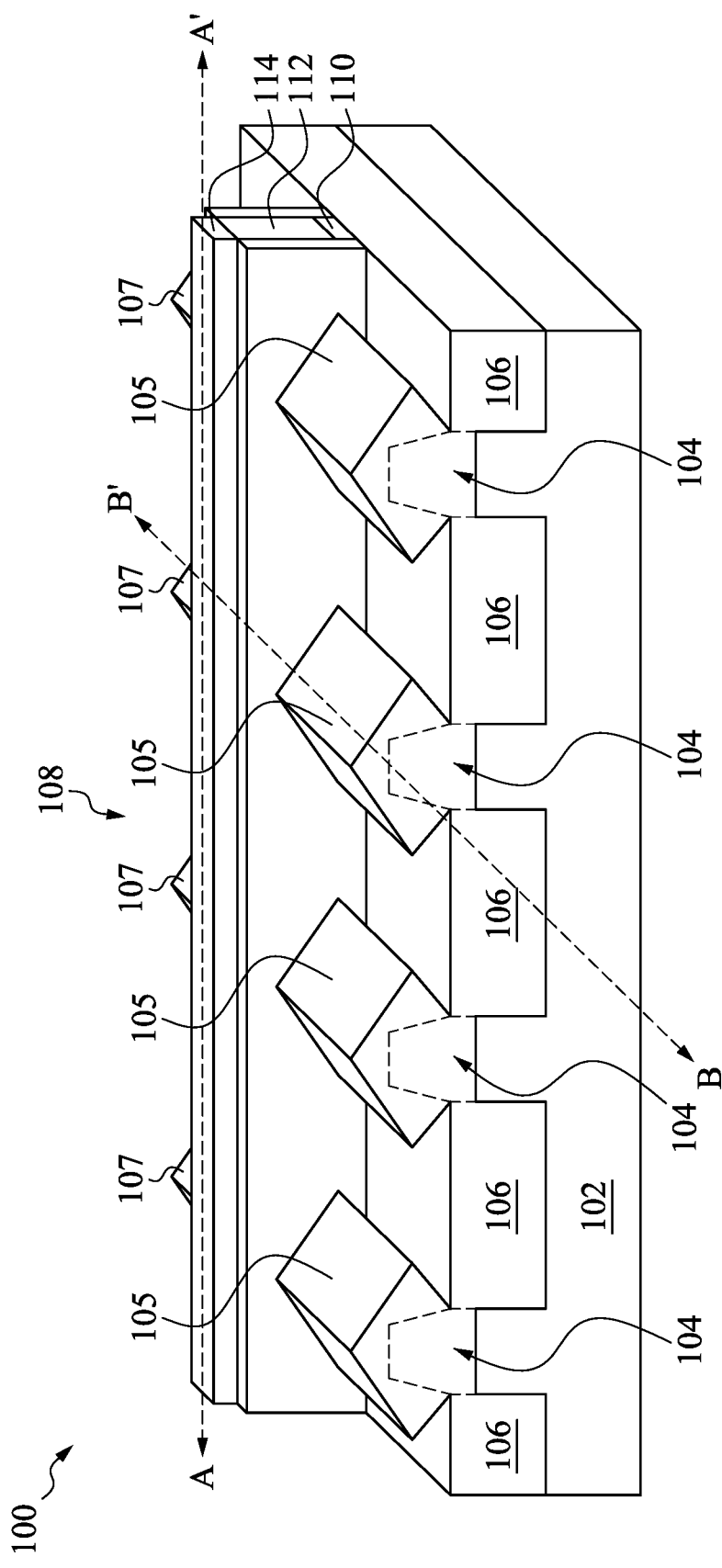
FIG. 1 is perspective view of an embodiment of a FinFET device according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is also noted that the present disclosure presents embodiments in the form of multi-gate transistors or fin-type multi-gate transistors referred to herein as FinFET devices. Such a device may include a P-type metal-oxide-semiconductor FinFET device or an N-type metal-oxide-semiconductor FinFET device. The FinFET device may be a dual-gate device, tri-gate device, bulk device, silicon-on-insulator (SOI) device, and/or other configuration. One of ordinary skill may recognize other embodiments of semiconductor devices that may benefit from aspects of the present disclosure. For example, some embodiments as described herein may also be applied to gate-all-around (GAA) devices, Omega-gate (Ω-gate) devices, or Pi-gate (Π-gate) devices.

Illustrated in FIG. 1 is a FinFET device 100. The FinFET device 100 includes one or more fin-based, multi-gate field-effect transistors (FETs). The FinFET device 100 includes a substrate 102, at least one fin element 104 extending from the substrate 102, isolation regions 106, and a gate structure 108 disposed on and around the fin-element 104. The substrate 102 may be a semiconductor substrate such as a silicon substrate. The substrate may include various layers, including conductive or insulating layers formed on the semiconductor substrate. The substrate may include various doping configurations depending on design requirements as is known in the art. The substrate may also include other semiconductors such as germanium, silicon carbide (SiC), silicon germanium (SiGe), or diamond. Alternatively, the substrate may include a compound semiconductor and/or an alloy semiconductor. Further, in some embodiments, the substrate may include an epitaxial layer (epi-layer), the substrate may be strained for performance enhancement, the substrate may include a silicon-on-insulator (SOI) structure, and/or the substrate may have other suitable enhancement features.

The fin-element 104, like the substrate 102, may comprise silicon or another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, InGaAs, GaInP, and/or GaInAsP; or combinations thereof. The fins 104 may be fabricated using suitable processes including photolithography and etch processes. The photolithography process may include forming a photoresist layer (resist) overlying the substrate (e.g., on a silicon layer), exposing the resist to a pattern, performing post-exposure bake processes, and developing the resist to form a masking element including the resist. In some embodiments, patterning the resist to form the masking element may be performed using an electron beam (e-beam) lithography process, an EUV lithography process, an immersion lithography process, or other appropriate lithography process. The masking element may then be used to protect regions of the substrate while an etch process forms recesses into the substrate 102, thereby leaving an extending fin 104. The recesses may be etched using a dry etch, a wet etch, or a combination thereof. Numerous other embodiments of methods to form the fins 104 on the substrate 102 may also be used.

Each of the plurality of fins 104 also include a source region 105 and a drain region 107 where the source/drain regions 105, 107 are formed in, on, and/or surrounding the fin 104. The source/drain regions 105, 107 may be epitaxially grown over the fins 104. In some embodiments, one or more layers of a low Schottky barrier height (SBH) material are formed over the source/drain regions 105, 107 to reduce a source/drain contact resistance. In some examples, the low SBH material includes a III-V material such as GaAs, $In_xGa_{1-x}As$, Ni—InAs, and/or other suitable materials. A channel region of a transistor is disposed within the fin 104, underlying the gate structure 108, along a plane substantially parallel to a plane defined by section BB' of FIG. 1. In some examples, the channel region of the fin includes silicon, a high-mobility material such as germanium, silicon germanium, as well as any of the compound semiconductors or alloy semiconductors discussed above and/or combinations thereof. High-mobility materials include those materials with an electron mobility greater than silicon. For example, higher than Si which has an intrinsic electron mobility at room temperature (300 K) of around 1350 $cm^2$/V-s and a hole mobility of around 480 $cm^2$/V-s. In some embodiments, the channel region includes a strained channel material. By way of example, the strained channel material may be formed by using a different material for each of the fin-element 104 and the substrate 102 such that there is a lattice mismatch between the fin-element 104 and the substrate 102. The lattice mismatch between the fin-element 104 and the substrate 102 may thus create strain (e.g., tensile or compressive) within the channel region. In various embodiments, such a strained channel material provides for increased carrier mobility (e.g., electron or hole mobility) and enhanced transistor performance. As such, in some embodiments, the high-mobility material discussed above may in some cases include a strained channel material.

The isolation regions 106 may be shallow trench isolation (STI) features. Alternatively, a field oxide, a LOCOS feature, and/or other suitable isolation features may be implemented on and/or within the substrate 102. The isolation regions 106 may be composed of silicon oxide, silicon nitride, silicon oxynitride, fluorine-doped silicate glass (FSG), a low-k dielectric, combinations thereof, and/or other suitable material known in the art. In an embodiment, the isolation structures are STI features and are formed by etching trenches in the substrate 102. The trenches may then be filled with an isolating material (e.g., such as a dielectric material), followed by a chemical mechanical polishing (CMP) process. However, other embodiments are possible. In some embodiments, the isolation regions 106 may include a multi-layer structure, for example, having one or more liner layers.

The gate structure 108 includes a gate stack having an interfacial layer 110 formed over the channel region of the fin 104, a gate dielectric layer 112 formed over the interfacial layer 110, and a metal layer 114 formed over the gate dielectric layer 112. The interfacial layer 110 may include a dielectric material such as silicon oxide layer ($SiO_2$) or silicon oxynitride (SiON). The interfacial layer 110 may be formed by chemical oxidation, thermal oxidation, atomic layer deposition (ALD), chemical vapor deposition (CVD), and/or other suitable method. The gate dielectric layer 112 may include a high-k dielectric layer such as hafnium oxide ($HfO_2$). Alternatively, the high-k dielectric layer may include other high-k dielectrics, such as $TiO_2$, HfZrO, $Ta_2O_3$, $HfSiO_4$, $ZrO_2$, $ZrSiO_2$, $La_2O_3$, combinations thereof, or other suitable material. In still other embodiments, the gate dielectric layer may include silicon dioxide or other suitable dielectric. The dielectric layer may be formed by ALD, physical vapor deposition (PVD), oxidation, and/or other suitable methods. The metal layer 114 may include a conductive layer such as W, TiN, TaN, WN, Re, Ir, Ru, Mo, Al, Cu, Co, Ni, combinations thereof, and/or other suitable compositions. In some embodiments, the metal layer 114 may include a first metal material for N-type FinFETs and a second metal material for P-type FinFETs. Thus the FinFET device 100 may include a dual work-function metal gate configuration. For example, the first metal material (e.g., for N-type devices) may include metals having a work function substantially aligned with a work function of the substrate conduction band, or at least substantially aligned with a work function of the conduction band of the channel region of the fin 104. Similarly, for example, the second metal material (e.g., for P-type devices) may include metals having a work function substantially aligned with a work function of the substrate valence band, or at least substantially aligned with a work function of the valence band of the channel region of the fin 104. Thus, the metal layer 114 may provide a gate electrode for the FinFET device 100, including both N-type and P-type FinFET devices 100. In some embodiments, the metal layer 114 may alternately include a polysilicon layer. The metal layer 114 may be formed using PVD, CVD, electron beam (e-beam) evaporation, and/or other suitable process. In some embodiments, sidewall spacers are formed on sidewalls of the gate structure 108. The sidewall spacers may include a dielectric material such as silicon oxide, silicon nitride, silicon carbide, silicon oxynitride, or combinations thereof.

Traditionally, advances in semiconductor manufacturing and integrated circuit (IC) performance have been achieved in large part by scaling down semiconductor IC dimensions (e.g., minimum feature size). At least one aspect of IC scaling has included reducing cell size (e.g., as part of a layout process). In some examples, reduction in FinFET cell size has included abutment of active regions, such as FinFET active regions, in neighboring cells. For purposes of this disclosure, active region abutment across neighboring cells may be referred to as a "continuous active region". In various examples, a continuous active region can lead to significant leakage current. In some cases, attempts have been made to reduce such leakage current by adding filler layers to enlarge a lithography window. However, use of such a filler layers will result in an area penalty (e.g., increase in area).

Figure 2A:
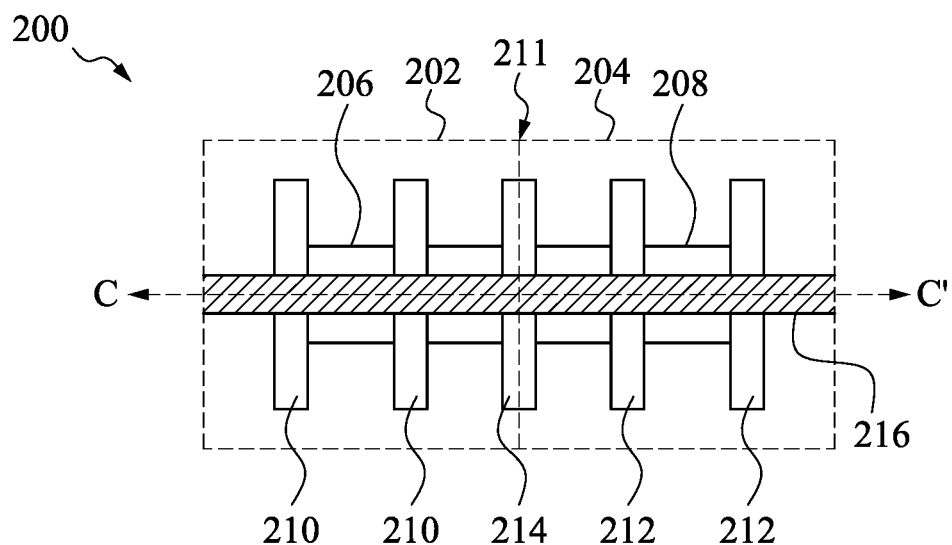
FIG. 2A illustrates a layout design of at least a portion of two neighboring FinFET cells.
Figure 2B:
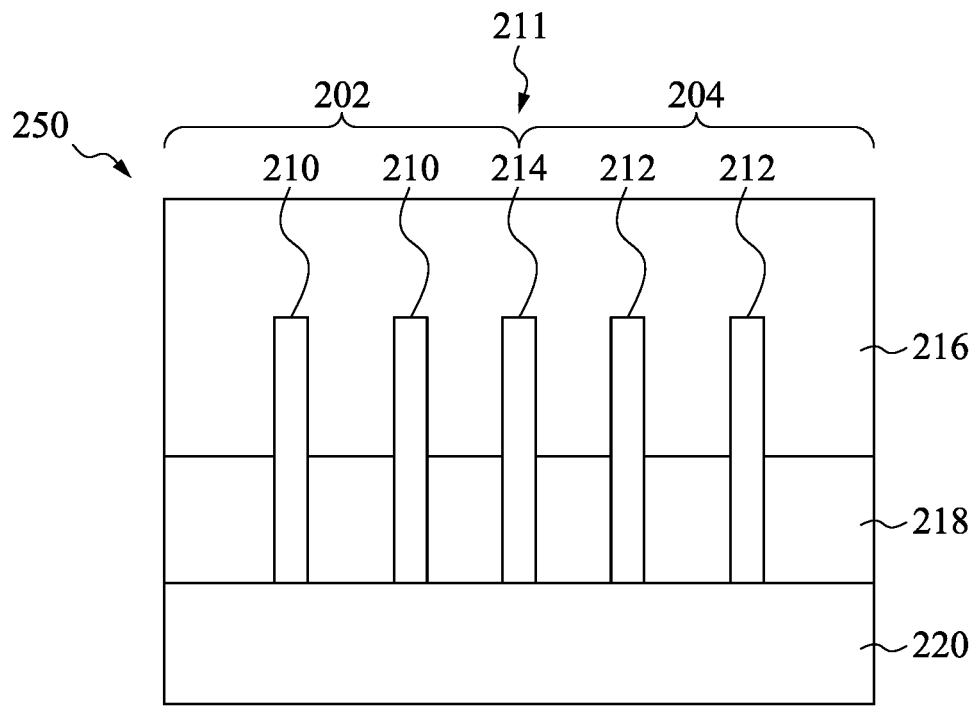
FIG. 2B illustrates a cross-section view of a FinFET device that substantially corresponds to section CC' of FIG. 2A.

Elaborating on neighboring FinFET cells, reference is now made to FIGS. 2A and 2B. FIG. 2A illustrates a layout design 200 of at least a portion of two neighboring FinFET cells. As shown, the layout design 200 includes a first cell 202 and a second cell 204 which abut one another along a cell boundary 211. Moreover, an active region 206 of the first cell 202 and an active region 208 of the second cell 204 also abut one another along the cell boundary 211. Thus, the layout design 200 provides an example of a continuous active region, as described above. The layout design 200 also includes active fins 210 and active fins 212 in each of the first cell 202 and the second cell 204, respectively. For purposes of discussion, the term "active fin", as used herein, may be used to indicate a fin region that includes a FinFET channel. In various examples, each of the active regions 206, 208 may include an N-type active region or a P-type active region. Thus, in some embodiments, the active fins 210, 212 may include N-type active fins or P-type active fins. To be sure, the embodiments disclosed herein are not meant to be limited to any particular doping configuration, and the examples provided herein are merely provided for purposes of illustration. In some embodiments, a dummy fin 214 is also formed between the first cell 202 and the second cell 204, along the cell boundary 211. By way of example, a "dummy" structure as used herein, such as a dummy fin, is to be understood as referring to a structure which is utilized to mimic a physical property of another structure (e.g., such as to mimic the physical dimensions of adjacent active fins 210, 212), and which is circuit inoperable (e.g., which is not intentionally part of a circuit current flow path, although unwanted leakage current may flow) in the final fabricated device. A gate 216, which spans the first cell 202 and the second cell 204, is also illustrated.

Referring to FIG. 2B, illustrated therein is a cross-section view of a FinFET device 250 that substantially corresponds to section CC' of FIG. 2A. FIG. 2B also illustrates the first cell 202 and the second cell 204 which abut one another along the cell boundary 211. The FinFET device 250 includes the active fins 210, 212, the dummy fin 214, the gate 216, a shallow trench isolation (STI) region 218, and a substrate 220. In some embodiments, the active fins 210, 212 and the dummy fin 214 may be formed as described above with respect to FIG. 1. In some cases, the active fins 210, 212 and the dummy fin 214 may include one or more epitaxial layers formed over the substrate 220, where such epitaxial layers have been deposited, patterned, and etched to form the active fins 210, 212 and the dummy fin 214. The STI region 218 may be similar to the isolation regions 106, the substrate 220 may be similar to the substrate 102, and the gate 216 may be similar to the gate structure 108, each of which has been described above. In various embodiments, the active fins 210, 212 may include N-type active fins or P-type active fins, and the gate 216 may include one or more metal and/or dielectric layers that provide an appropriate work function for the given device type (e.g., N-type or P-type). While leakage current may generally be present in devices including a continuous active region, in some cases, such leakage current may be more severe when abutting active regions are of the same type (e.g., N-type or P-type). Thus, for purposes of discussion, consider that both of the active regions 206, 208 include an N-type active region (e.g., such that both active fins 210, 212 are N-type active fins), or consider that both of the active regions 206, 208 include a P-type active region (e.g., such that both active fins 210, 212 are P-type active fins). In some cases, leakage current may be more severe for devices with abutting active regions of the same type, for example, because such devices may have similar threshold voltages. Thus, it may be particularly challenging to control leakage current, especially near the cell boundary 211, when abutting active regions are of the same type (e.g., N-type or P-type). In various examples, such leakage current can lead to device failure and/or degradation of device performance.

Embodiments of the present disclosure offer advantages over the existing art, though it is understood that other embodiments may offer different advantages, not all advantages are necessarily discussed herein, and no particular advantage is required for all embodiments. For example, embodiments discussed herein include methods and structures for mitigating leakage current in devices that include a continuous active region. As noted above, leakage current may be more severe for devices with abutting active regions of the same type, for example, because such devices may have similar threshold voltages. Thus, in various embodiments, isolation between neighboring cells and thus isolation between abutting active regions is improved by increasing a threshold voltage at the cell boundary (e.g., at a location of the dummy fin 214). In some cases, the threshold voltage is increased with respect to the adjacent and abutting active regions. For clarity of discussion, it is noted that transistor threshold voltage ($V_t$) and flatband voltage ($V_{fb}$) may be generally expressed as:

$$V_t = V_{fb} + \frac{\sqrt{2q\epsilon N_A 2\varphi_B}}{C_{ox}}$$

$$V_{fb} = \varphi_{ms} + 2\varphi_B - \frac{Q_f}{C_{ox}}$$

From these two expressions for Vt and Vfb, it is clear that threshold voltage ($V_t$) is affected by a gate metal work function (e.g., $\varphi_{ms}$ is defined as a difference in metal work function, $\varphi_m$, and semiconductor work function, $\varphi_s$), by a substrate doping and substrate type (e.g., $N_A$, $\varphi_B$, $\epsilon$), and by gate dielectric composition (e.g., $C_{ox}$), among other factors. Thus, in some embodiments, the threshold voltage at the cell boundary is increased by changing a photomask logic operation (LOP) to reverse a threshold voltage type at the cell boundary (e.g., from N-type to P-type, or from P-type to N-type). In some examples, such threshold voltage reversal, or adjustment in general, may be performed by adjustment of the work function metal and/or a gate dielectric layer. Alternatively, in some cases, the threshold voltage at the cell boundary is increased by performing a threshold voltage implant (e.g., an ion implant) at the cell boundary, and into the dummy gate disposed at the cell boundary. Further, in some embodiments, the threshold voltage at the cell boundary is increased by use of a silicon germanium (SiGe) channel at the cell boundary. In some cases, the SiGe may be disposed within the substrate at the cell boundary and/or the SiGe may be part of the dummy gate disposed at the cell boundary. Therefore, embodiments of the present disclosure provide for improved isolation, and thus decreased leakage current, between neighboring cells having abutting active regions. Those skilled in the art will recognize other benefits and advantages of the methods and structures as described herein, and the embodiments described are not meant to be limiting beyond what is specifically recited in the claims that follow.

Examples of various embodiments, including the various ways to improve isolation between neighboring cells by increasing a threshold voltage at the cell boundary, will now be discussed. In some embodiments, the threshold voltage at the cell boundary is increased by changing a photomask LOP to reverse a threshold voltage type at the cell boundary, for example, by adjusting the work function metal and/or a gate dielectric layer. In some cases, changing the photomask LOP may provide one to two orders of magnitude reduction in leakage current at the cell boundary. Referring now to FIGS. 3A, 3B, and 3C, illustrated therein are layout designs that may be used to set a work function of a metal gate for various pairs of neighboring N-type cells that have a continuous active region. In some examples, the layout designs shown and described may be used to set a work function of a metal gate, such as the gate 216 or the gate structure 108, described above. In addition, it will be understood that the various features (e.g., fins, active regions, openings, etc.) illustrated and discussed with reference to the layout designs of FIGS. 3A, 3B, and 3C may be patterned using a set of masks. However, for purposes of this discussion, aspects of the layout designs that are related to setting a work function of a metal layer will be emphasized and noted accordingly. Moreover, in some cases, aspects of the layout designs that are related to setting a work function of a metal layer may be patterned using a plurality of separate and individual masks, as discussed below. Referring first to FIG. 3A, illustrated therein is a layout design 300, a layout design 302, a layout design 304, and a layout design 306. Each of the layout designs 300, 302, 304, 306 include a first cell 308 and a second cell 310 which abut one another along a cell boundary 311. In some examples, the first cell 308 may be an N-type standard threshold voltage (NSVT) cell, and the second cell 310 may be an N-type low threshold voltage (NLVT) cell. As shown, an active region 312 of the first cell 308 and an active region 314 of the second cell 310 may also abut one another along the cell boundary 311. In some examples, the first cell 308 includes active fins 316, the second cell 310 includes active fins 318, and a dummy fin 320 is disposed between the first cell 308 and the second cell 310, along the cell boundary 311. For clarity, certain features in the layout designs 302, 304, 306 which are substantially the same as features shown and identified in the layout design 300 are not once again labeled, but may be referred to in the discussion that follows using the reference numbers presented above.

With respect to setting a work function of a metal layer, a set of separate and individual masks may be used to achieve a target threshold voltage of the dummy fin 320 at the cell boundary 311. For example, as part of forming the one or more metal and/or dielectric layers that provide an appropriate work function (e.g., for the gate 216 or the gate structure 108), each of the one or more layers (e.g., gate layers) may be deposited, patterned, and etched, as discussed in more detail with respect to the method of FIG. 5. For instance, a first gate layer may be deposited and a first mask that includes a pattern of an opening 322 (e.g., shown in the layout design 300) may be used to pattern/define a portion of the first gate layer that is to be removed (e.g., by way of an etching process). For purposes of this discussion, the "opening" described herein may refer to an opening in a photoresist layer. For example, a photoresist layer may be deposited and patterned (e.g., by an exposure process using a mask having a layout as described herein, followed by a development process), where the resulting patterned photoresist layer includes the opening. In some cases, an underlying layer (e.g., exposed by the opening) may then be removed (e.g., by an etching process). In some embodiments, the first gate layer may include a dielectric layer such as $SiO_2$ or SiON, or a high-K dielectric layer such as $HfO_2$, $TiO_2$, HfZrO, $Ta_2O_3$, $HfSiO_4$, $ZrO_2$, $ZrSiO_2$, and $La_2O_3$. Thus, according to the layout design 300, the first gate layer may be removed from the region defined by the opening 322 (e.g., from over the active fins 316 and the dummy fin 320). Thereafter, a second gate layer may be deposited and a second mask that includes a pattern of an opening 324 and an opening 326 (e.g., shown in the layout design 302) may be used to pattern/define a portion of the second gate layer that is to be removed. In some embodiments, the second gate layer may include a P-type work function metal (PWFM) layer. In some cases, the second gate layer may include a TiN layer. In at least some examples, the second gate layer may have a thickness of about 12 Angstroms. Thus, according to the layout design 302, the second gate layer may be removed from the region defined by the opening 324 (e.g., from over the active fins 316) and the opening 326 (e.g., from over the active fins 318), while remaining over the dummy fin 320. At least some existing processes, in contrast to the present embodiment, may additionally remove the second gate layer from over the dummy fin 320. A third gate layer may then be deposited and a third mask without opening patterns in the first cell 308 or the second cell 310 (e.g., shown in the layout design 304) may be used to ensure that the third gate layer is retained over the first cell 308 and the second cell 310. In some embodiments, the third gate layer may also include a PWFM layer. By way of example, the third gate layer may include a first layer stacked over a second layer, such as a TiN stacked over TaN, or TaN stacked over TiN. In some examples, the stacked third gate layer may include a TiN layer with a thickness of about 10 Angstroms, and a TaN layer with a thickness of about 15 Angstroms. Thus, according to the layout design 304, the third gate layer may not be removed from the first or second cells 308, 310 (e.g., from over the active fins 316, 318 and over the dummy fin 320). To be sure, in some cases, the third mask may include patterns/openings in other areas of the mask that are not depicted in the layout design 304. In some embodiments, a fourth gate layer may then be deposited and a fourth mask that includes a pattern of an opening 328 and an opening 330 (e.g., shown in the layout design 306) may be used to pattern/define a portion of the fourth gate layer that is to be removed. In some embodiments, the fourth gate layer may include a PWFM layer. In some cases, the fourth gate layer may include a TiN layer. In at least some examples, the fourth gate layer may have a thickness of about 10 Angstroms. Thus, according to the layout design 306, the fourth gate layer may be removed from the region defined by the opening 328 (e.g., from over the active fins 316) and the opening 330 (e.g., from over the active fins 318), while remaining over the dummy fin 320. At least some existing processes, in contrast to the present embodiment, may additionally remove the fourth gate layer from over the dummy fin 320.

Thus, FIG. 3A provides layout designs for a plurality of masks that may be used to set a work function of a metal gate for an NSVT cell and a neighboring NLVT cell, where the two neighboring cells have a continuous active region. Further, while the various gate layer depositions, corresponding mask patterning, and layer removal (if necessary) were described as being performed according to a particular sequence, it will be understood that other sequences may be used, and the present disclosure is not intended to be limited to any particular sequence. In addition, some of the steps described may be removed or replaced, without departing from the scope of the present disclosure. Moreover, by performing the process described above with reference to FIG. 3A, the threshold voltage at the cell boundary 311 is increased by changing a photomask LOP to reverse a threshold voltage type at the cell boundary 311 (e.g., at the dummy fin 320).

Referring now to FIG. 3B, illustrated therein is a layout design 332, a layout design 334, a layout design 336, and a layout design 338. Each of the layout designs 332, 334, 336, 338 includes a first cell 340 and a second cell 342 which abut one another along a cell boundary 341. In some examples, the first cell 340 may be an N-type standard threshold voltage (NSVT) cell, and the second cell 342 may be an N-type ultra-low threshold voltage (NULVT) cell. An active region 344 of the first cell 340 and an active region 346 of the second cell 342 may also abut one another along the cell boundary 341. In some examples, the first cell 340 includes active fins 348, the second cell 342 includes active fins 350, and a dummy fin 352 is disposed between the first cell 340 and the second cell 342, along the cell boundary 341. For clarity, certain features in the layout designs 334, 336, 338 which are substantially the same as features shown and identified in the layout design 332 are not once again labeled, but may be referred to in the discussion that follows using the reference numbers presented above.

Similar to the example described above, a set of separate and individual masks may be used to set a work function of a metal layer to achieve a target threshold voltage of the dummy fin 352 at the cell boundary 341. Moreover, in some embodiments, each of the first gate layer, second gate layer, third gate layer, and fourth gate layer may be substantially the same as discussed above with reference to FIG. 3A. However, the example of FIG. 3B provides layout designs for a plurality of masks that may be used to set a work function of a metal gate for an NSVT cell and a neighboring NULVT cell, where the two neighboring cells have a continuous active region.

By way of example, and with reference to FIG. 3B, the first gate layer may be deposited and a first mask that includes a pattern of an opening 354 (e.g., shown in the layout design 332) may be used to pattern/define a portion of the first gate layer that is to be removed (e.g., by way of an etching process). Thus, according to the layout design 332, the first gate layer may be removed from the region defined by the opening 354 (e.g., from over the active fins 348, the active fins 350, and the dummy fin 352). Thereafter, the second gate layer may be deposited and a second mask that includes a pattern of an opening 356 and an opening 358 (e.g., shown in the layout design 334) may be used to pattern/define a portion of the second gate layer that is to be removed. Thus, according to the layout design 334, the second gate layer may be removed from the region defined by the opening 356 (e.g., from over the active fins 348) and the opening 358 (e.g., from over the active fins 350), while remaining over the dummy fin 352. At least some existing processes, in contrast to the present embodiment, may additionally remove the second gate layer from over the dummy fin 352. The third gate layer may then be deposited and a third mask that includes a pattern of an opening 360 (e.g., shown in the layout design 336) may be used to pattern/define a portion of the third gate layer that is to be removed. Thus, according to the layout design 336, the third gate layer may be removed from the region defined by the opening 360 (e.g., from over the active fins 350), while remaining over the dummy fin 352 and over the active fins 348. In some embodiments, the fourth gate layer may then be deposited and a fourth mask that includes a pattern of an opening 362 (e.g., shown in the layout design 338) may be used to pattern/define a portion of the fourth gate layer that is to be removed. Thus, according to the layout design 338, the fourth gate layer may be removed from the region defined by the opening 362 (e.g., from over the active fins 348), while remaining over the dummy fin 352 and over the active fins 350. At least some existing processes, in contrast to the present embodiment, may additionally remove the fourth gate layer from over the dummy fin 352. While the various gate layer depositions, corresponding mask patterning, and layer removal (if necessary) were described as being performed according to a particular sequence, it will be understood that other sequences may be used, and the present disclosure is not intended to be limited to any particular sequence. In addition, some of the steps described may be removed or replaced, without departing from the scope of the present disclosure. Moreover, by performing the process described above with reference to FIG. 3B, the threshold voltage at the cell boundary 341 is increased by changing a photomask LOP to reverse a threshold voltage type at the cell boundary 341 (e.g., at the dummy fin 352).

With reference to FIG. 3C, illustrated therein is a layout design 364, a layout design 366, a layout design 368, and a layout design 370. Each of the layout designs 364, 366, 368, 370 includes a first cell 372 and a second cell 374 which abut one another along a cell boundary 371. In some examples, the first cell 372 may be an N-type low threshold voltage (NLVT) cell, and the second cell 374 may be an N-type ultra-low threshold voltage (NULVT) cell. An active region 376 of the first cell 372 and an active region 378 of the second cell 374 may also abut one another along the cell boundary 371. In some examples, the first cell 372 includes active fins 380, the second cell 374 includes active fins 382, and a dummy fin 384 is disposed between the first cell 372 and the second cell 374, along the cell boundary 371. For clarity, certain features in the layout designs 366, 368, 370 which are substantially the same as features shown and identified in the layout design 364 are not once again labeled, but may be referred to in the discussion that follows using the reference numbers presented above.

Similar to the prior examples, a set of separate and individual masks may be used to set a work function of a metal layer to achieve a target threshold voltage of the dummy fin 384 at the cell boundary 371. Moreover, in some embodiments, each of the first gate layer, second gate layer, third gate layer, and fourth gate layer may be substantially the same as discussed above with reference to FIG. 3A. However, the example of FIG. 3C provides layout designs for a plurality of masks that may be used to set a work function of a metal gate for an NLVT cell and a neighboring NULVT cell, where the two neighboring cells have a continuous active region.

Referring to FIG. 3C, the first gate layer may be deposited and a first mask that includes a pattern of an opening 386 (e.g., shown in the layout design 364) may be used to pattern/define a portion of the first gate layer that is to be removed (e.g., by way of an etching process). Thus, according to the layout design 364, the first gate layer may be removed from the region defined by the opening 386 (e.g., from over the active fins 382 and the dummy fin 382). Thereafter, the second gate layer may be deposited and a second mask that includes a pattern of an opening 388 and an opening 390 (e.g., shown in the layout design 366) may be used to pattern/define a portion of the second gate layer that is to be removed. Thus, according to the layout design 366, the second gate layer may be removed from the region defined by the opening 388 (e.g., from over the active fins 380) and the opening 390 (e.g., from over the active fins 382), while remaining over the dummy fin 384. At least some existing processes, in contrast to the present embodiment, may additionally remove the second gate layer from over the dummy fin 384. The third gate layer may then be deposited and a third mask that includes a pattern of an opening 392 (e.g., shown in the layout design 368) may be used to pattern/define a portion of the third gate layer that is to be removed. Thus, according to the layout design 368, the third gate layer may be removed from the region defined by the opening 392 (e.g., from over the active fins 382), while remaining over the dummy fin 384 and over the active fins 380. In some embodiments, the fourth gate layer may then be deposited and a fourth mask that includes a pattern of an opening 394 (e.g., shown in the layout design 370) may be used to pattern/define a portion of the fourth gate layer that is to be removed. Thus, according to the layout design 370, the fourth gate layer may be removed from the region defined by the opening 394 (e.g., from over the active fins 380), while remaining over the dummy fin 384 and over the active fins 382. At least some existing processes, in contrast to the present embodiment, may additionally remove the fourth gate layer from over the dummy fin 384. While the various gate layer depositions, corresponding mask patterning, and layer removal (if necessary) were described as being performed according to a particular sequence, it will be understood that other sequences may be used, and the present disclosure is not intended to be limited to any particular sequence. In addition, some of the steps described may be removed or replaced, without departing from the scope of the present disclosure. Moreover, by performing the process described above with reference to FIG. 3C, the threshold voltage at the cell boundary 371 is increased by changing a photomask LOP to reverse a threshold voltage type at the cell boundary 371 (e.g., at the dummy fin 384).

Continuing with embodiments where the threshold voltage at the cell boundary is increased by changing a photomask LOP to reverse a threshold voltage type at the cell boundary (e.g., by adjusting the work function metal and/or a gate dielectric layer), reference is now made to FIGS. 4A, 4B, and 4C. Various aspects of FIGS. 4A, 4B, and 4C are similar to the examples of FIGS. 3A, 3B, and 3C, discussed above. For example, each of the first gate layer, second gate layer, third gate layer, and fourth gate layer discussed with reference to FIGS. 4A, 4B, and 4C may be substantially the same as discussed above with reference to FIG. 3A. Thus, for clarity of discussion, certain features which are substantially the same as features shown and described above may be briefly discussed, while focusing on the differences provided in FIGS. 4A, 4B, and 4C. In particular, FIGS. 4A, 4B, and 4C illustrate layout designs that may be used to set a work function of a metal gate for various pairs of neighboring P-type cells that have a continuous active region.

With reference first to FIG. 4A, illustrated therein is a layout design 400, a layout design 402, a layout design 404, and a layout design 406. Each of the layout designs 400, 402, 404, 406 includes a first cell 408 and a second cell 410 which abut one another along a cell boundary 411. In some examples, the first cell 408 may be a P-type standard threshold voltage (PSVT) cell, and the second cell 410 may be a P-type low threshold voltage (PLVT) cell. An active region 412 of the first cell 408 and an active region 414 of the second cell 410 may also abut one another along the cell boundary 411. In some examples, the first cell 408 includes active fins 416, the second cell 410 includes active fins 418, and a dummy fin 420 is disposed between the first cell 408 and the second cell 410, along the cell boundary 411. For clarity, certain features in the layout designs 402, 404, 406 which are substantially the same as features shown and identified in the layout design 400 are not once again labeled, but may be referred to in the discussion that follows using the reference numbers presented above.

Still with reference to FIG. 4A, the first gate layer may be deposited and a first mask that includes a pattern of an opening 422 (e.g., shown in the layout design 400) may be used to pattern/define a portion of the first gate layer that is to be removed. Thus, according to the layout design 400, the first gate layer may be removed from the region defined by the opening 422 (e.g., from over the active fins 416), while remaining over the dummy fin 420. At least some existing processes, in contrast to the present embodiment, may additionally remove the first gate layer from over the dummy fin 420. Thereafter, the second gate layer may be deposited and a second mask that includes a pattern of an opening 424 (e.g., shown in the layout design 402) may be used to pattern/define a portion of the second gate layer that is to be removed. Thus, according to the layout design 402, the second gate layer may be removed from the region defined by the opening 424 (e.g., from over the active fins 416 and from over the dummy fin 420). The third gate layer may then be deposited and a third mask that includes a pattern of an opening 426 (e.g., shown in the layout design 404) may be used to pattern/define a portion of the third gate layer that is to be removed. Thus, according to the layout design 404, the third gate layer may be removed from the region defined by the opening 426 (e.g., from over the dummy fin 420), while remaining over the active fins 416, 418. At least some existing processes, in contrast to the present embodiment, may instead not remove the third gate layer from over the dummy fin 420. In some embodiments, the fourth gate layer may then be deposited and a fourth mask that includes a pattern of an opening 428 (e.g., shown in the layout design 406) may be used to pattern/define a portion of the fourth gate layer that is to be removed. Thus, according to the layout design 406, the fourth gate layer may be removed from the region defined by the opening 428 (e.g., from over the dummy fin 420), while remaining over the active fins 416, 418. At least some existing processes, in contrast to the present embodiment, may instead not remove the fourth gate layer from over the dummy fin 420. While the various gate layer depositions, corresponding mask patterning, and layer removal (if necessary) were described as being performed according to a particular sequence, it will be understood that other sequences may be used, and the present disclosure is not intended to be limited to any particular sequence. In addition, some of the steps described may be removed or replaced, without departing from the scope of the present disclosure. Moreover, by performing the process described above with reference to FIG. 4A, the threshold voltage at the cell boundary 411 is increased by changing a photomask LOP to reverse a threshold voltage type at the cell boundary 411 (e.g., at the dummy fin 420).

With reference now to FIG. 4B, illustrated therein is a layout design 432, a layout design 434, a layout design 436, and a layout design 438. Each of the layout designs 432, 434, 436, 438 includes a first cell 440 and a second cell 442 which abut one another along a cell boundary 441. In some examples, the first cell 440 may be a P-type standard threshold voltage (PSVT) cell, and the second cell 442 may be a P-type ultra-low threshold voltage (PULVT) cell. An active region 444 of the first cell 440 and an active region 446 of the second cell 442 may also abut one another along the cell boundary 441. In some examples, the first cell 440 includes active fins 448, the second cell 442 includes active fins 450, and a dummy fin 452 is disposed between the first cell 440 and the second cell 442, along the cell boundary 441. For clarity, certain features in the layout designs 434, 436, 438 which are substantially the same as features shown and identified in the layout design 432 are not once again labeled, but may be referred to in the discussion that follows using the reference numbers presented above.

Still referring to FIG. 4B, the first gate layer may be deposited and a first mask that includes a pattern of an opening 453 and an opening 454 (e.g., shown in the layout design 432) may be used to pattern/define a portion of the first gate layer that is to be removed. Thus, according to the layout design 432, the first gate layer may be removed from the region defined by the opening 453 (e.g., from over the active fins 448) and by the opening 454 (e.g., from over the active fins 450), while remaining over the dummy fin 452. At least some existing processes, in contrast to the present embodiment, may additionally remove the first gate layer from over the dummy fin 452. Thereafter, the second gate layer may be deposited and a second mask that includes a pattern of an opening 456 (e.g., shown in the layout design 434) may be used to pattern/define a portion of the second gate layer that is to be removed. Thus, according to the layout design 434, the second gate layer may be removed from the region defined by the opening 456 (e.g., from over the active fins 448 and from over the dummy fin 452). The third gate layer may then be deposited and a third mask that includes a pattern of an opening 460 (e.g., shown in the layout design 436) may be used to pattern/define a portion of the third gate layer that is to be removed. Thus, according to the layout design 436, the third gate layer may be removed from the region defined by the opening 460 (e.g., from over the dummy fin 452), while remaining over the active fins 448, 450. At least some existing processes, in contrast to the present embodiment, may instead not remove the third gate layer from over the dummy fin 452. In some embodiments, the fourth gate layer may then be deposited and a fourth mask that includes a pattern of an opening 462 (e.g., shown in the layout design 438) may be used to pattern/define a portion of the fourth gate layer that is to be removed. Thus, according to the layout design 438, the fourth gate layer may be removed from the region defined by the opening 462 (e.g., from over the dummy fin 452), while remaining over the active fins 448, 450. At least some existing processes, in contrast to the present embodiment, may instead not remove the fourth gate layer from over the dummy fin 452. While the various gate layer depositions, corresponding mask patterning, and layer removal (if necessary) were described as being performed according to a particular sequence, it will be understood that other sequences may be used, and the present disclosure is not intended to be limited to any particular sequence. In addition, some of the steps described may be removed or replaced, without departing from the scope of the present disclosure. Moreover, by performing the process described above with reference to FIG. 4B, the threshold voltage at the cell boundary 441 is increased by changing a photomask LOP to reverse a threshold voltage type at the cell boundary 441 (e.g., at the dummy fin 452).

With reference to FIG. 4C, illustrated therein is a layout design 464, a layout design 466, a layout design 468, and a layout design 470. Each of the layout designs 464, 466, 468, 470 includes a first cell 472 and a second cell 474 which abut one another along a cell boundary 471. In some examples, the first cell 472 may be a P-type low threshold voltage (PLVT) cell, and the second cell 474 may be a P-type ultra-low threshold voltage (PULVT) cell. An active region 476 of the first cell 472 and an active region 478 of the second cell 474 may also abut one another along the cell boundary 471. In some examples, the first cell 472 includes active fins 480, the second cell 474 includes active fins 482, and a dummy fin 484 is disposed between the first cell 472 and the second cell 474, along the cell boundary 471. For clarity, certain features in the layout designs 466, 468, 470 which are substantially the same as features shown and identified in the layout design 464 are not once again labeled, but may be referred to in the discussion that follows using the reference numbers presented above.

Still with reference to FIG. 4C, the first gate layer may be deposited and a first mask that includes a pattern of an opening 486 (e.g., shown in the layout design 464) may be used to pattern/define a portion of the first gate layer that is to be removed. Thus, according to the layout design 464, the first gate layer may be removed from the region defined by the opening 486 (e.g., from over the active fins 482), while remaining over the dummy fin 484 and over the active fins 480. Thereafter, the second gate layer may be deposited and a second mask that includes a pattern of an opening 488 (e.g., shown in the layout design 466) may be used to pattern/define a portion of the second gate layer that is to be removed. Thus, according to the layout design 466, the second gate layer may be removed from the region defined by the opening 488 (e.g., from over the dummy fin 484), while remaining over the active fins 480, 482. At least some existing processes, in contrast to the present embodiment, may instead not remove the second gate layer from over the dummy fin 484. The third gate layer may then be deposited and a third mask that includes a pattern of an opening 490 (e.g., shown in the layout design 468) may be used to pattern/define a portion of the third gate layer that is to be removed. Thus, according to the layout design 468, the third gate layer may be removed from the region defined by the opening 490 (e.g., from over the dummy fin 484), while remaining over the active fins 480, 482. At least some existing processes, in contrast to the present embodiment, may instead not remove the third gate layer from over the dummy fin 484. In some embodiments, the fourth gate layer may then be deposited and a fourth mask that includes a pattern of an opening 492 (e.g., shown in the layout design 470) may be used to pattern/define a portion of the fourth gate layer that is to be removed. Thus, according to the layout design 470, the fourth gate layer may be removed from the region defined by the opening 492 (e.g., from over the dummy fin 484), while remaining over the active fins 480, 482. At least some existing processes, in contrast to the present embodiment, may instead not remove the fourth gate layer from over the dummy fin 484. While the various gate layer depositions, corresponding mask patterning, and layer removal (if necessary) were described as being performed according to a particular sequence, it will be understood that other sequences may be used, and the present disclosure is not intended to be limited to any particular sequence. In addition, some of the steps described may be removed or replaced, without departing from the scope of the present disclosure. Moreover, by performing the process described above with reference to FIG. 4C, the threshold voltage at the cell boundary 471 is increased by changing a photomask LOP to reverse a threshold voltage type at the cell boundary 474 (e.g., at the dummy fin 484).

Figure 5:
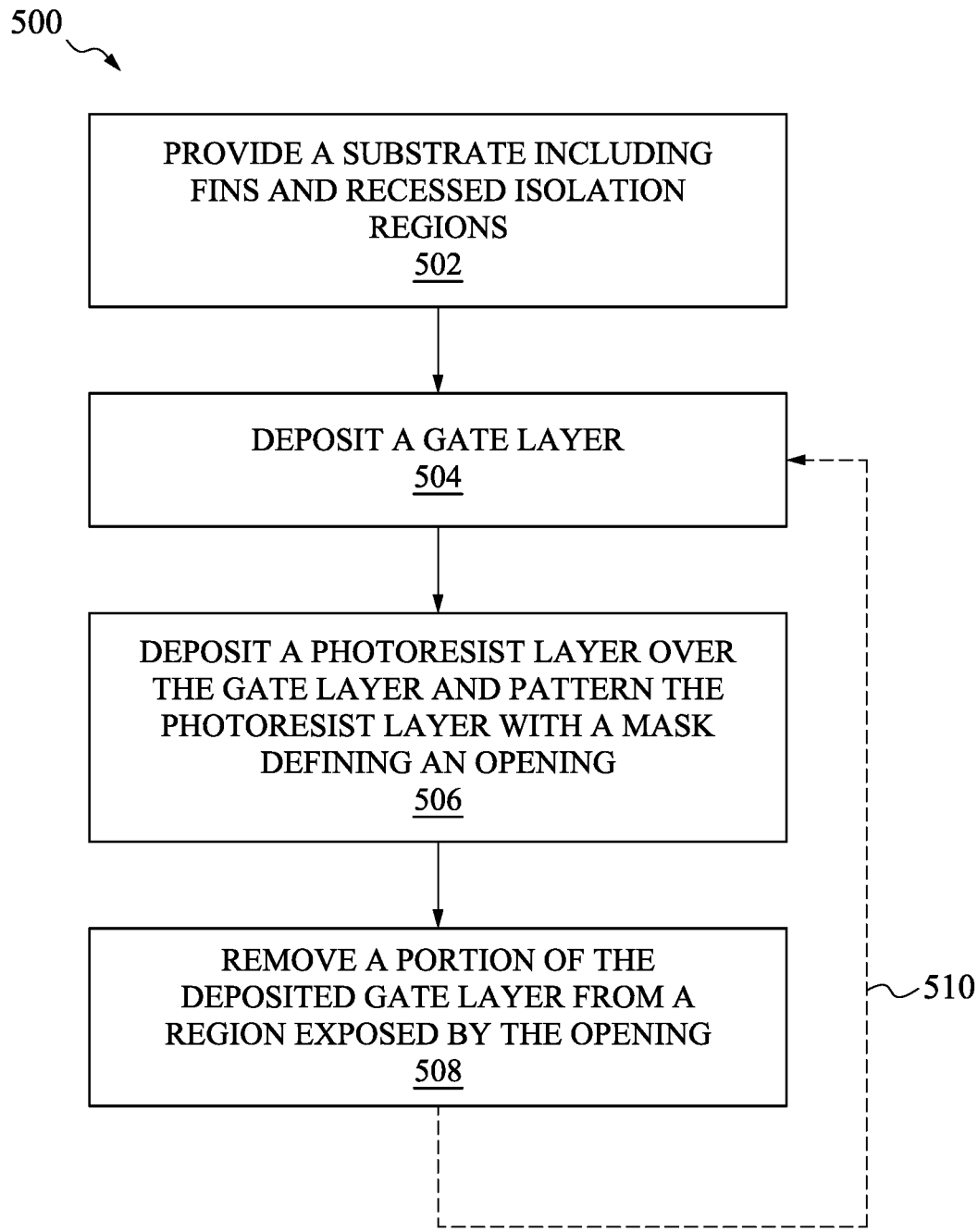
FIG. 5 is a flow chart of a method of fabricating a FinFET device according to one or more aspects of the present disclosure.

FIG. 5 illustrates a method 500 of fabricating a semiconductor device including a FinFET device. The method 500 may be used to change a photomask LOP to reverse a threshold voltage type at a cell boundary, for example, using one or more of the masks and mask sequences described above with reference to FIGS. 3A, 3B, 3C, 4A, 4B, and 4C. In some embodiments, the method 500 may be used to fabricate the device 100 or the device 250, described above. Thus, one or more aspects discussed above may also apply to the method 500.

The method 500 begins at block 502 where a substrate including fins and recessed isolation regions is provided. In various examples, the substrate, the fins, and the recessed isolation regions may be substantially the same as described above with reference to FIG. 1 and FIG. 2B. The method proceeds to block 504 where a gate layer is deposited. In some embodiments, the deposited gate layer may include a layer deposited during formation of the gate 216 or the gate structure 108, described above. In some embodiments, the deposited gate layer includes the first gate layer, the second gate layer, the third gate layer, or the fourth gate layer described above with reference to FIGS. 3A, 3B, 3C, 4A, 4B, and 4C. The method proceeds to block 506 where a photoresist layer is deposited over the gate layer, and the photoresist layer is patterned using a mask. In some embodiments, the photoresist layer may be patterned (e.g., by a photolithography process) using a mask that has a pattern defining an opening (e.g., in the photoresist layer), and where the opening defines a portion of the deposited gate layer that is to be removed. The method proceeds to block 508 where a portion of the deposited gate layer is removed from a region exposed by the patterned opening in the photoresist layer to form a patterned deposited gate layer. In some examples, the portion of the deposited gate layer may be removed by way of an etching process (e.g., a wet etching process, a dry etching process, or a combination thereof). In some cases, after the etching process, the patterned photoresist layer may be removed (e.g., by way of a solvent). In some embodiments, after removing the portion of the deposited gate layer (block 508), the method 500 may continue at block 504, as indicated by dashed line 510, where another gate layer is deposited. The process of depositing another gate layer, patterning a photoresist layer formed over the gate layer using a mask, and removing a portion of the layer may continue until a target work function, and thus a target threshold voltage, is achieved. Additional process steps may be implemented before, during, and after the method 500, and some process steps described above may be replaced or eliminated in accordance with various embodiments of the method 500.

Figure 6:
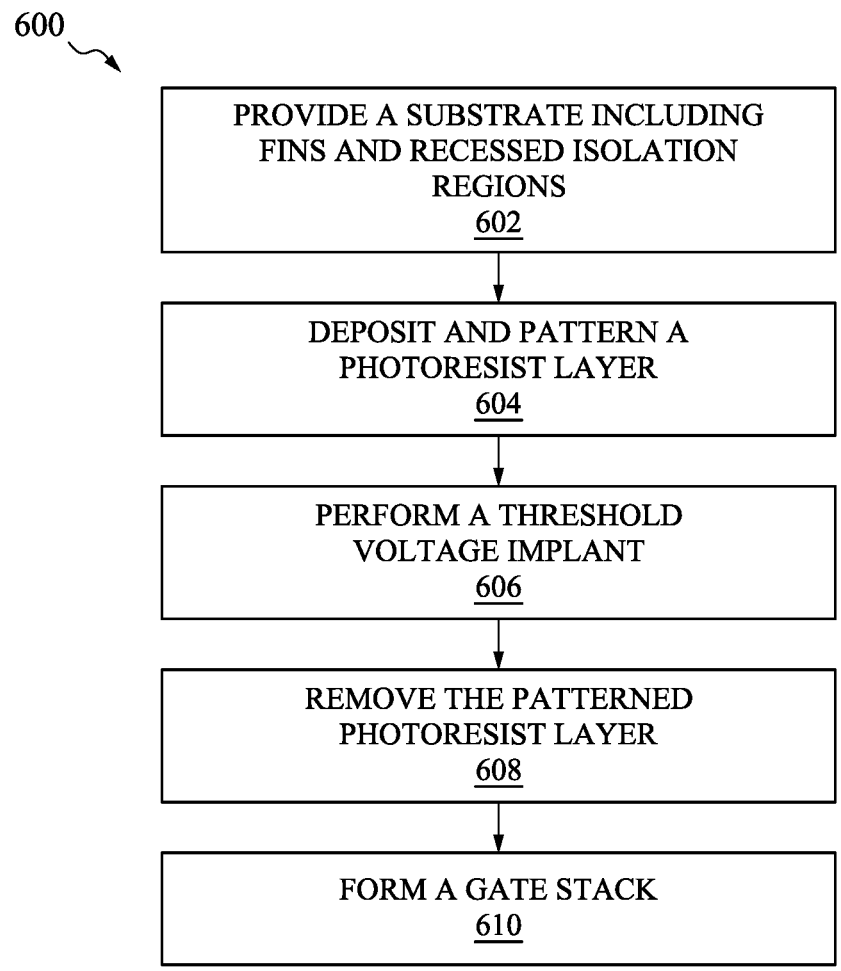
FIG. 6 is a flow chart of an alternative method of fabricating a FinFET device according to one or more aspects of the present disclosure.

In some embodiments, isolation between neighboring cells may be improved by increasing a threshold voltage at the cell boundary, for example, by performing a threshold voltage implant (e.g., an ion implant) at the cell boundary and into the dummy gate disposed at the cell boundary. Referring to FIG. 6, illustrated therein is a method 600 of fabricating a semiconductor device including a FinFET device. The method 600 may be used to increase a threshold voltage at the cell boundary, for example, by performing a threshold voltage implant at the cell boundary. In some embodiments, the method 600 may be used to fabricate the device 100 or the device 250, described above. Thus, one or more aspects discussed above may also apply to the method 600. Additionally, FIGS. 7-11 provide cross-section views of an exemplary device 700 fabricated according to one or more steps of the method 600 of FIG. 6.

Figure 7:
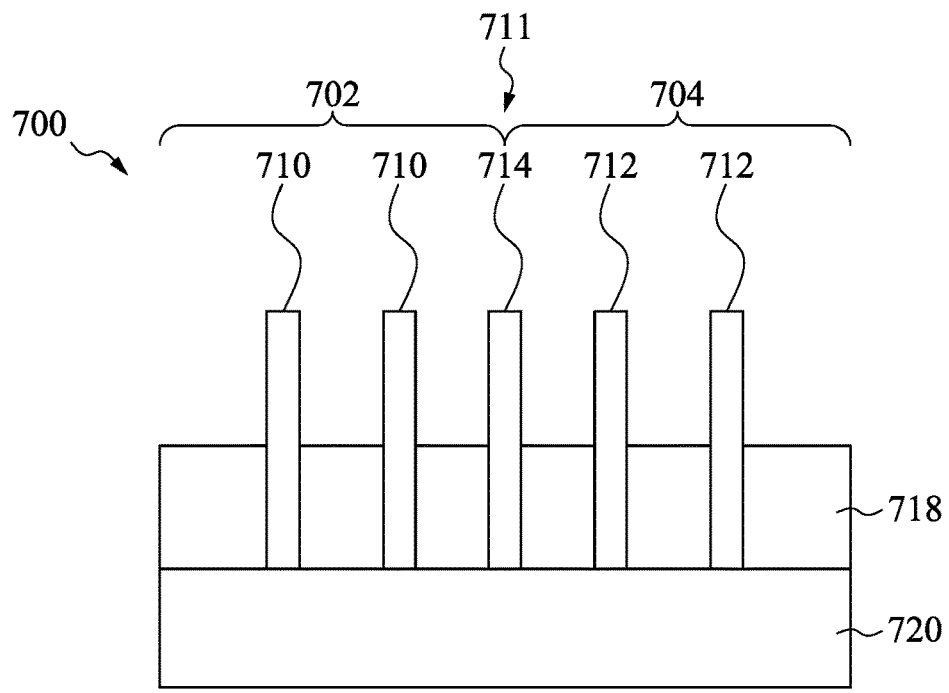
FIGS. 7, 8, 9, 10, and 11 illustrate cross-section views of an embodiment of a FinFET device corresponding to one or more steps of the method of FIG. 6.
Figure 8:
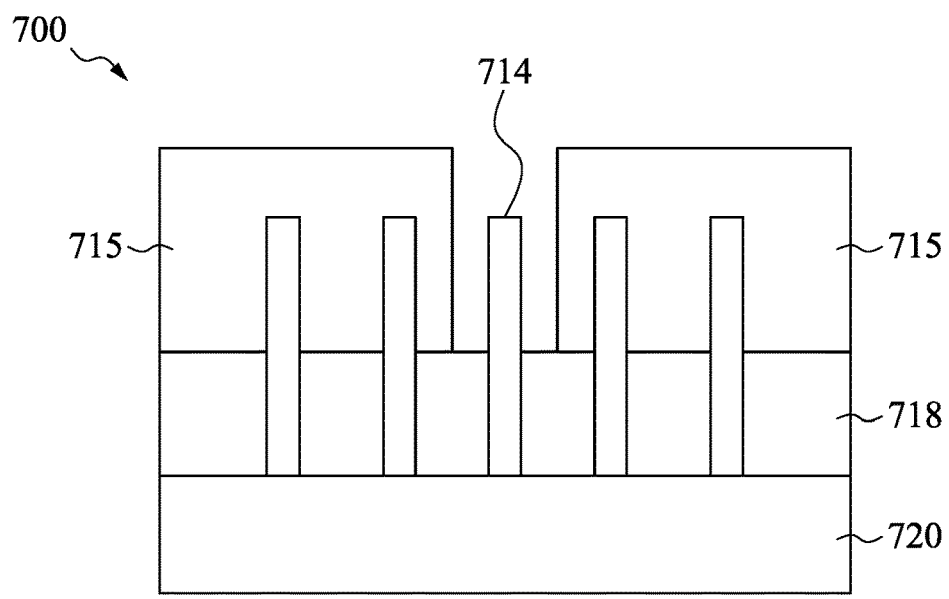
Figure 9:
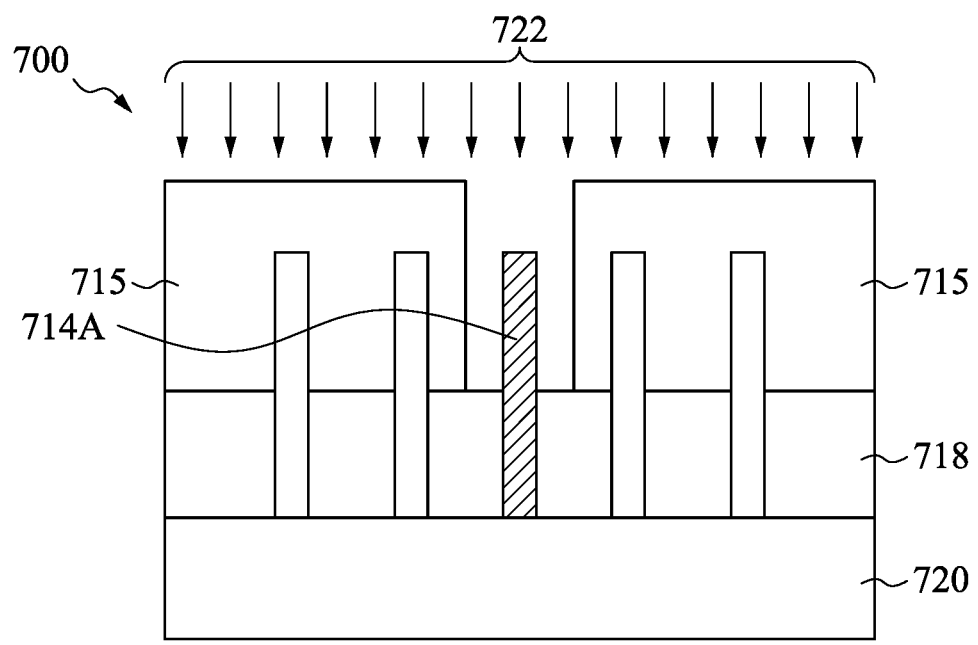
Figure 10:
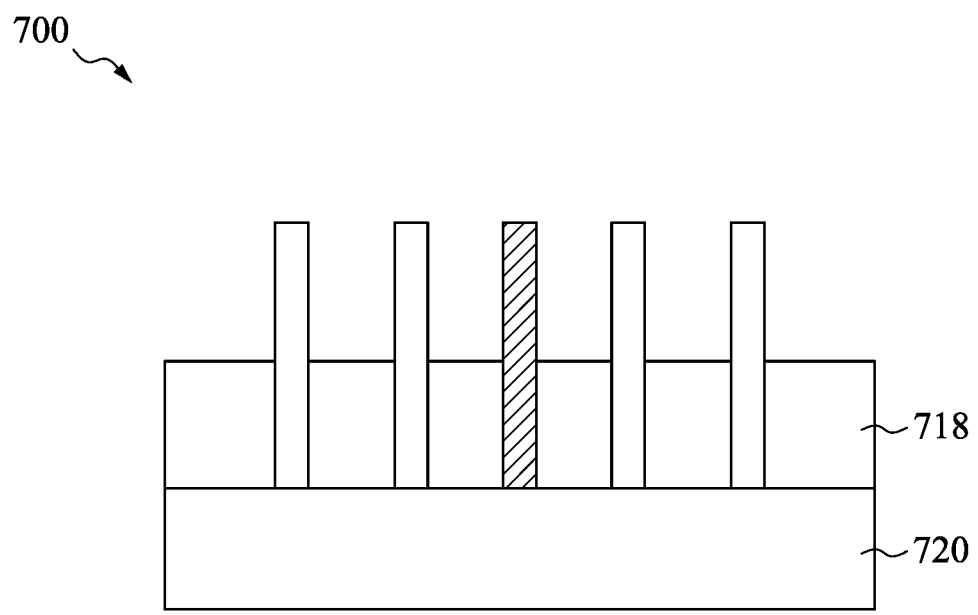
Figure 11:
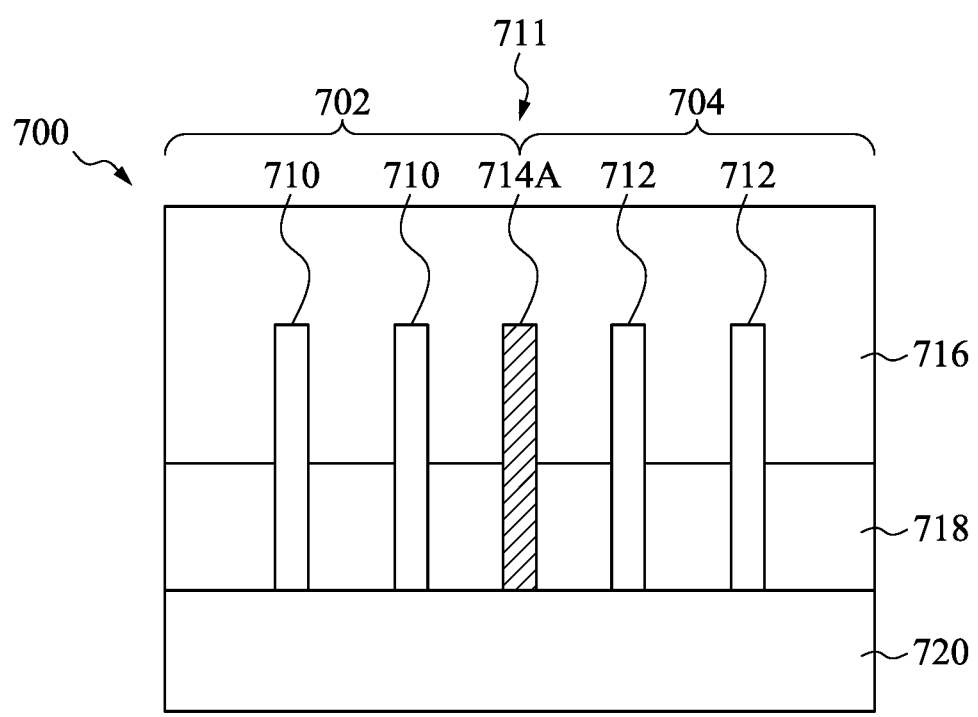

The method 600 begins at block 602 where a substrate including fins and recessed isolation regions is provided. With reference to the example of FIG. 7, in an embodiment of block 602, the device 700 includes active fins 710, 712, a dummy fin 714, a recessed STI region 718, and a substrate 720. In various examples, the substrate 720, the active fins 710, 712, the dummy fin 714, and the recessed STI region 718 may be substantially the same as described above with reference to FIG. 1 and FIG. 2B. FIG. 7 also illustrates a first cell 702 and a second cell 704 which abut one another along a cell boundary 711. The method proceeds to block 604 where a photoresist layer is deposited and patterned. With reference to the example of FIG. 8, in an embodiment of block 604, a patterned photoresist layer 715 is formed over the substrate 720. In some examples, a photoresist layer is first deposited (e.g., by a spin-coating method, a vapor deposition method, or other appropriate method). After deposition, the photoresist layer may be exposed to a pattern, a post-exposure bake process may be performed, and the exposed photoresist layer is developed to form the patterned photoresist layer 715. In some embodiments, the photoresist layer may be exposed using an electron beam (e-beam) lithography process, an EUV lithography process, an immersion lithography process, or other appropriate process. As shown in FIG. 8, the patterned photoresist layer 715 has been patterned to expose the dummy fin 714 along the cell boundary 711, while leaving the active fins 710, 712 covered by the patterned photoresist layer 715. The method proceeds to block 606 where a threshold voltage implant is performed. With reference to the example of FIG. 9, in an embodiment of block 606, a threshold voltage (Vt) implant 722 is performed to provide an ion-implanted dummy fin 714A. In various embodiments, the Vt implant 722 may be performed, for example using an ion implantation process and employing a suitable N-type or P-type dopant. In some embodiments the N-type dopant includes arsenic, phosphorous, antimony, or other N-type donor material. In some embodiments, the P-type dopant includes boron, $BF_2$, aluminum, gallium, indium, or other P-type acceptor material.

In some cases, an N-type dopant may be used as a P-Vt implant, meaning that the N-type dopant may be implanted into the dummy fin 714 when the active fins 710, 712 are P-type fins. Similarly, and in some cases, a P-type dopant may be used as an N-Vt implant, meaning that the P-type dopant may be implanted into the dummy fin 714 when the active fins 710, 712 are N-type fins. In some embodiments, the Vt implant 722 is performed using $BF_2$ with a dosage greater than about $3.3 \times 10^{13}$. In some examples, the Vt implant 722 is performed using phosphorous with a dosage greater than about $4.5 \times 10^{13}$. In some cases, the Vt implant 722 may increase the threshold voltage of the dummy fin 714 by greater than about 70 mV. In some cases, the Vt implant 722 may provide greater than one order of magnitude reduction in leakage current at the cell boundary 711. In various embodiments, the Vt implant 722 may be performed at a channel implant step, at an LDD implant step, or at another suitable implant step. In some cases, after the ion implantation process, the semiconductor device 700 may be subjected to a high temperature anneal in order to remove defects and activate dopants (i.e., to place dopants into substitutional sites). The method proceeds to block 608 where the patterned photoresist layer is removed. With reference to the example of FIGS. 9 and 10, in an embodiment of block 608, the patterned photoresist layer 715 has been removed, for example, by way of a solvent. The method proceeds to block 610 where a gate stack is formed. With reference to the example of FIGS. 10 and 11, in an embodiment of block 610, a gate stack 716 is formed over the active fins 710, 712, and over the ion-implanted dummy fin 714A. In some embodiments, the gate stack 716 may be similar to the gate 216 or the gate structure 108, described above. Additionally, in some cases, the gate stack 716 may include one or more metal and/or dielectric layers that provide an appropriate work function for the given device type (e.g., N-type or P-type). Thus, while the device 700 may include abutting active regions of the same type (e.g., N-type or P-type), because of the increased threshold voltage of the ion-implanted dummy fin 714A, the leakage current at the cell boundary 711 is significantly reduced. Stated another way, the ion-implanted dummy fin 714A serves to improve isolation between the neighboring first and second cells 702, 704.

The semiconductor device 700 may undergo further processing to form various features and regions known in the art. For example, subsequent processing may form a gate stack, sidewall spacers, source/drain regions, various contacts/vias/lines and multilayers interconnect features (e.g., metal layers and interlayer dielectrics) on the substrate 720, configured to connect the various features to form a functional circuit that may include one or more FinFET devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 600, and some process steps described above may be replaced or eliminated in accordance with various embodiments of the method 600.

Figure 12:
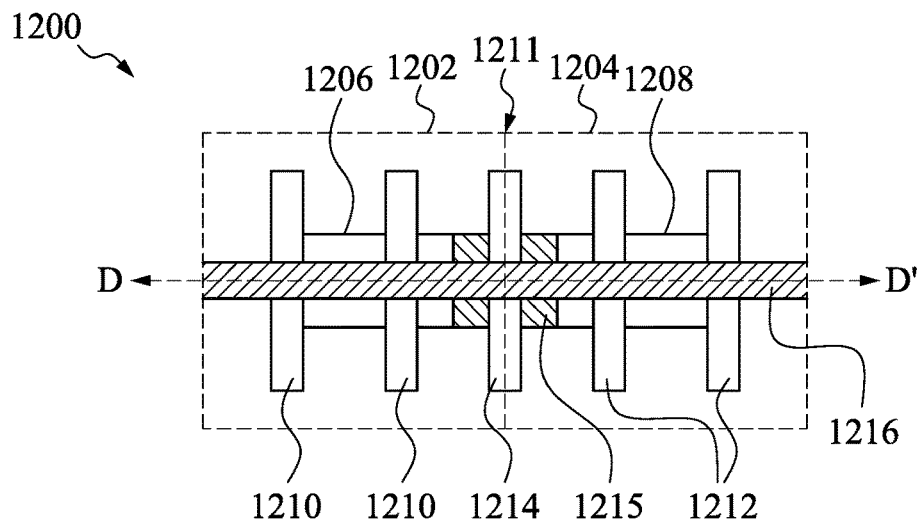
FIG. 12 illustrates a layout design of at least a portion of two neighboring FinFET cells and including a SiGe region, in accordance with some embodiments.

In some examples, isolation between neighboring cells may be improved by increasing a threshold voltage at the cell boundary, for example, by use of a silicon germanium (SiGe) channel at the cell boundary. In some cases, the SiGe may be disposed within the substrate at the cell boundary and/or the SiGe may be part of the dummy gate disposed at the cell boundary. For example, FIG. 12 illustrates a layout design 1200 of two neighboring FinFET cells. Specifically, a first cell 1202 and a second cell 1204 abut one another along a cell boundary 1211. The layout design 1200 is similar to the layout design 200 of FIG. 2A, discussed above. However, as shown in FIG. 12, a SiGe region 1215 is formed between an active region 1206 of the first cell 1202 and an active region 1208 of the second cell 1204. The layout design 1200 also includes active fins 1210 and active fins 1212 in each of the first cell 1202 and the second cell 1204, respectively. Additionally, a dummy fin 1214 is formed between the first cell 1202 and the second cell 1204, along the cell boundary 1211. In some embodiments, the dummy fin 1214, or at least a portion of the dummy fin that includes the FinFET channel, may include SiGe from the SiGe region 1215. Alternatively, in some examples, the dummy fin 1214 may include a material different than the SiGe substrate portion over which it is disposed. A gate 1216, which spans the first cell 1202 and the second cell 1204, is also illustrated. In some embodiments, the SiGe region 1215 may be formed of $Si_{(1-x)}Ge_x$, where 'x' is a percentage of Ge, and where 'x' is greater than 0% and less than 100%. By way of example, and in at least some embodiments, the SiGe region 1215 may include 30% Ge($Si_{0.7}Ge_{0.3}$), causing the threshold voltage of the dummy fin 1214 to be increased by about 52 mV. In some cases, use of SiGe at the cell boundary may reduce leakage current at the cell boundary 1211 by about 0.36×. To be sure, the embodiments disclosed herein are not meant to be limited to any particular percentage of Ge content in the SiGe region 1215, and the examples provided herein are merely provided for purposes of illustration. In various examples, the Ge content in the SiGe region 1215 may be adjusted in order to achieve a desired threshold voltage (e.g., of the dummy fin 1214) and leakage current at the cell boundary 1211. In some examples, the SiGe region 1215 may be implemented at the cell boundary 1211 of neighboring N-type cells. In some embodiments, the SiGe region 1215 has a width of about 48 nm, which in some cases, may be equal to about one poly pitch.

Figure 13:
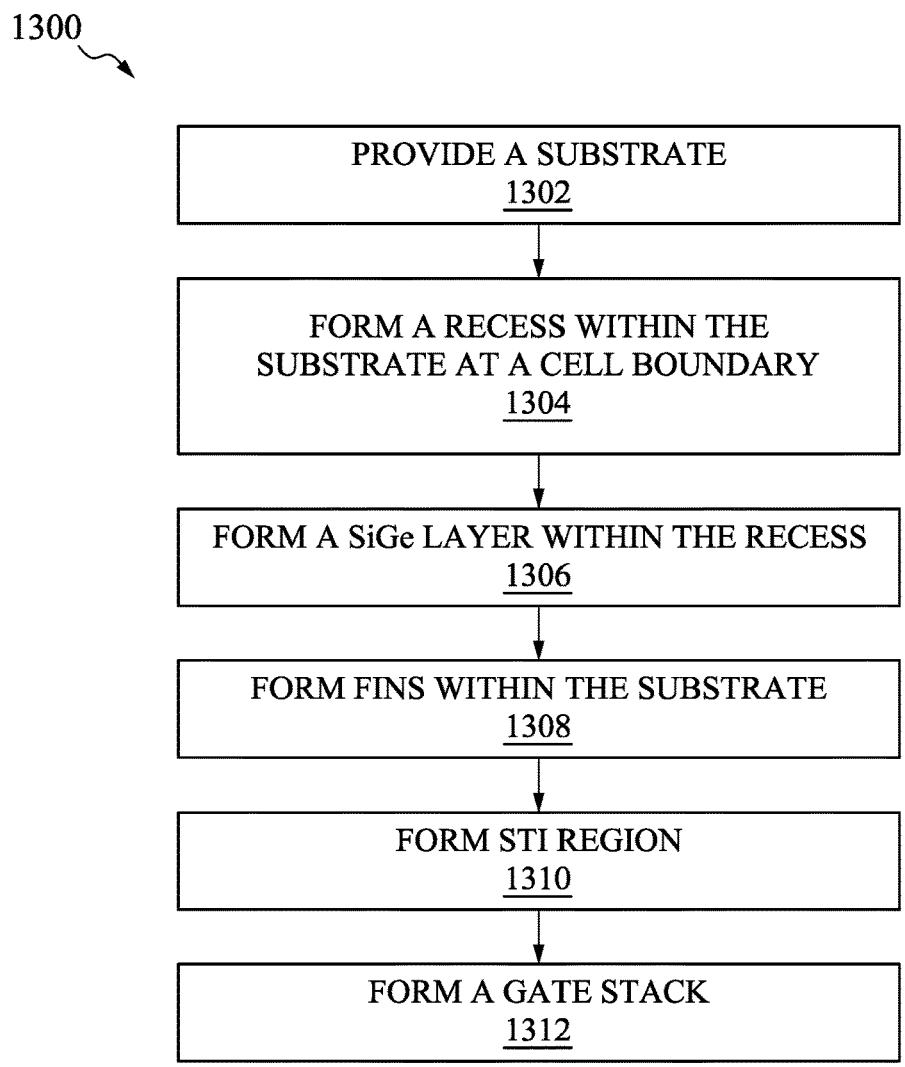
FIG. 13 is a flow chart of a further method of fabricating a FinFET device according to one or more aspects of the present disclosure.
Figure 14:
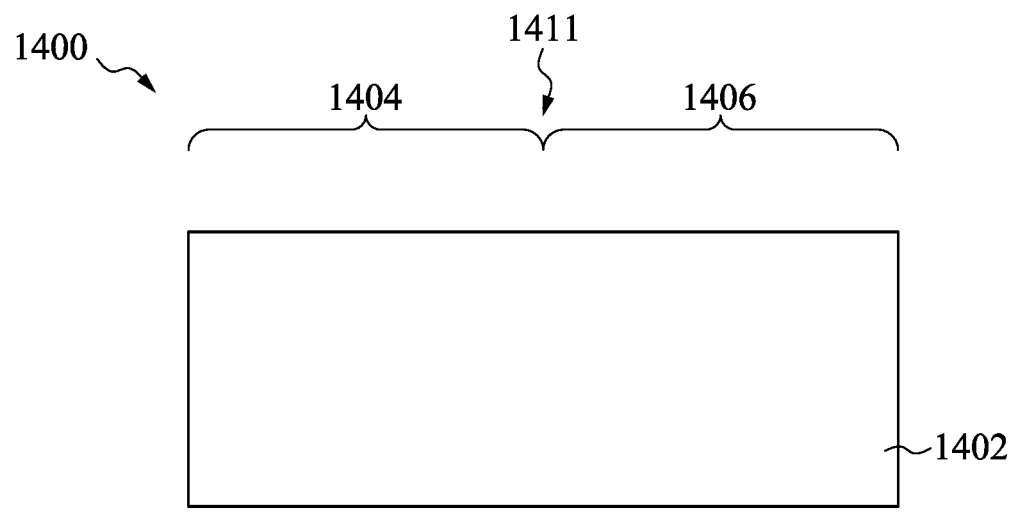
FIGS. 14, 15, 16, 17, 18, and 19 illustrate cross-section views of an embodiment of a FinFET device corresponding to one or more steps of the method of FIG. 13.
Figure 15:
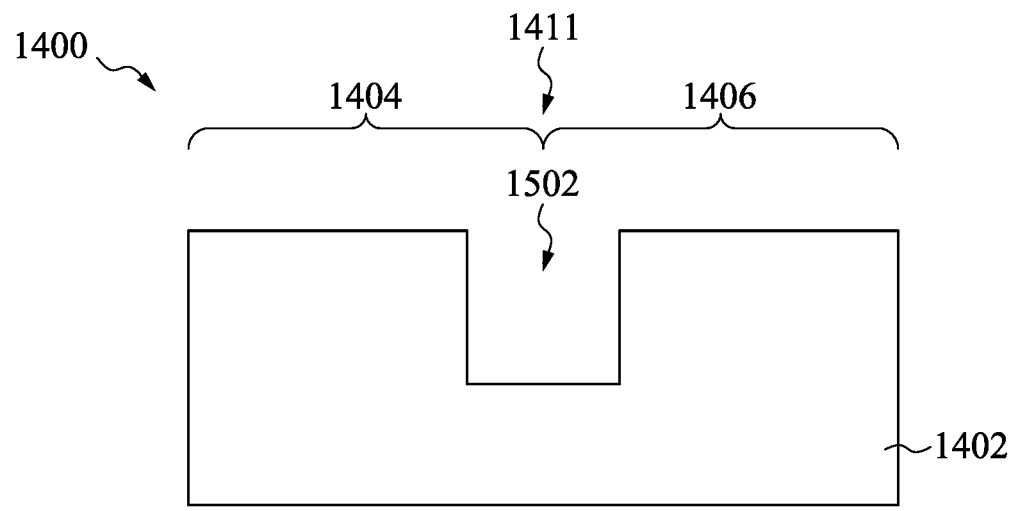
Figure 16:
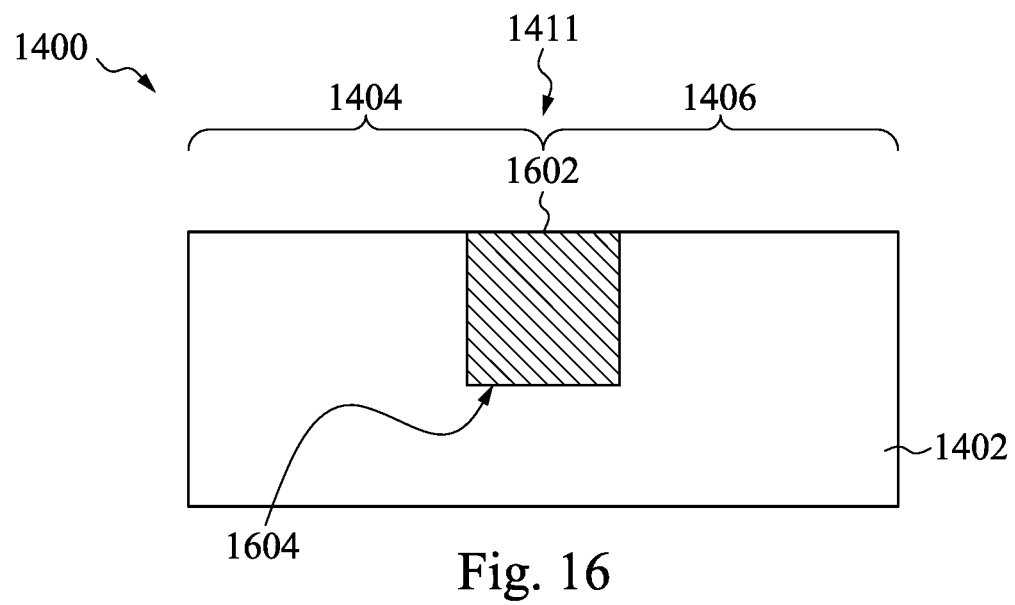
Figure 17:
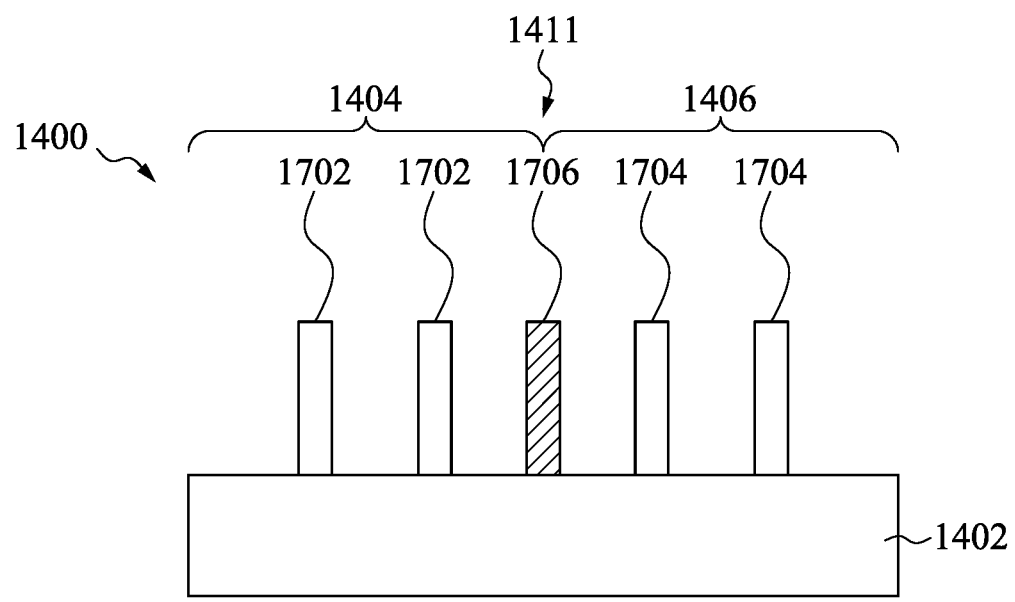
Figure 18:
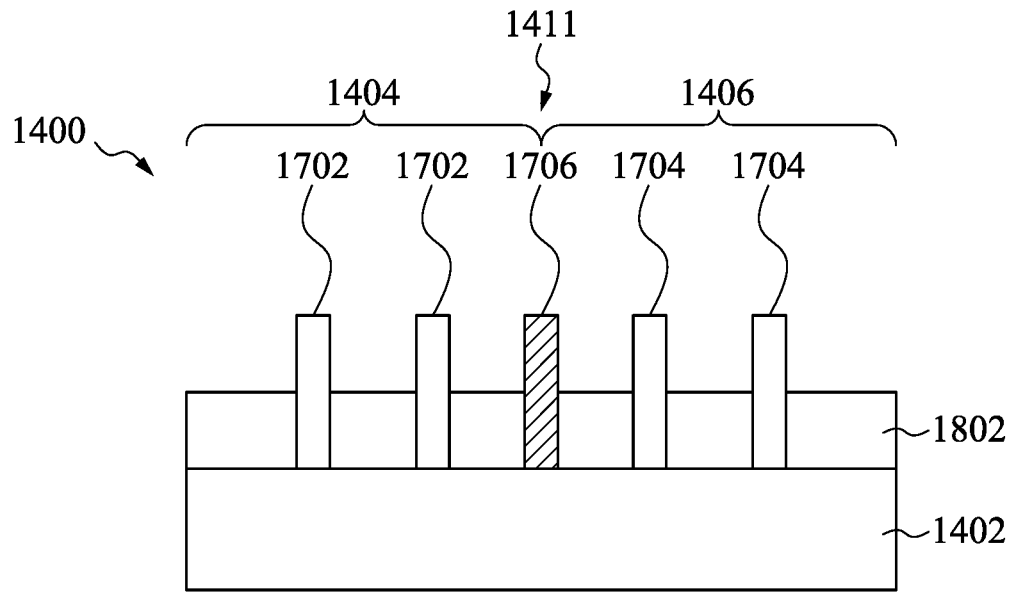
Figure 19:
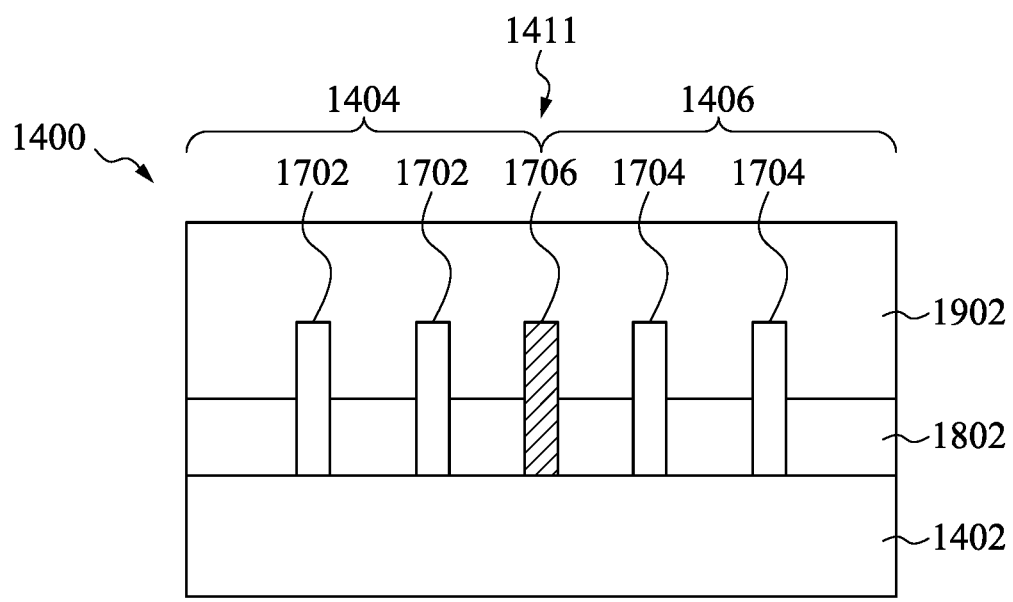

Referring now to FIG. 13, illustrated therein is a method 1300 of fabricating a semiconductor device including a FinFET device. The method 1300 may be used to increase a threshold voltage at the cell boundary, for example, by use of a silicon germanium (SiGe) channel at the cell boundary. In some embodiments, the method 1300 may be used to fabricate the device 100 or the device 250, described above. Thus, one or more aspects discussed above may also apply to the method 1300. Additionally, FIGS. 14-19 provide cross-section views of an exemplary device 1400, that substantially correspond to section DD' of FIG. 12, fabricated according to one or more steps of the method 1300 of FIG. 13.

The method 1300 begins at block 1302 where a substrate is provided. With reference to the example of FIG. 14, in an embodiment of block 1302, a substrate 1402 is provided. In some embodiments, the substrate 1402 may be substantially the same as described above with reference to FIG. 1 and FIG. 2B. In various examples, the substrate 1402 may include a first cell region 1404 and a second cell region 1406 which abut one another along a cell boundary 1411. The method proceeds to block 1304 where a recess is formed within the substrate at a cell boundary. With reference to the example of FIG. 15, in an embodiment of block 1304, a recess 1502 is formed within the substrate 1402 at the cell boundary 1411. In some embodiments, the recess 1502 may be formed by a photolithography and etching process. In some cases, the recess 1502 defines a SiGe region, as discussed in more detail below. The method proceeds to block 1306 where a SiGe layer is formed within the recess. With reference to the example of FIGS. 15 and 16, in an embodiment of block 1306, a SiGe layer 1602 is formed within the recess 1502 at the cell boundary 1411. In various embodiments, the SiGe layer 1602 may be epitaxially grown within the recess 1502. In some embodiments, the SiGe layer 1602 may be formed of $Si_{(1-x)}Ge_x$, as described above. The method proceeds to block 1308 where fins are formed within the substrate. With reference to the example of FIGS. 16 and 17, in an embodiment of block 1308, active fins 1702 are formed within the substrate 1402 and within the first cell region 1404, active fins 1704 are formed within the substrate 1402 and within the second cell region 1406, and a dummy fin 1706 is formed within the SiGe layer 1602 along the cell boundary 1411. In some embodiments, the active fins 1702, 1704 and the dummy fin 1706 may be formed as described above with respect to FIG. 1. In some cases, the etching process used to form recesses in the SiGe layer 1602 to form the SiGe dummy fin 1706 may or may not etch to a bottom surface 1604 of the recess 1502. The method proceeds to block 1310 where an STI region is formed. With reference to the example of FIGS. 17 and 18, in an embodiment of block 1310, an STI region 1802 is formed. In some cases, the STI region 1802 includes a recessed STI region. Additionally, in some embodiments, the recessed STI region 1802 may be substantially the same as described above with reference to FIG. 1 and FIG. 2B. The method proceeds to block 1312 where a gate stack is formed. With reference to the example of FIGS. 18 and 19, in an embodiment of block 1312, a gate stack 1902 is formed over the active fins 1702, 1704, and over the SiGe dummy fin 1706. In some embodiments, the gate stack 1902 may be similar to the gate 216 or the gate structure 108, described above. Additionally, in some cases, the gate stack 1902 may include one or more metal and/or dielectric layers that provide an appropriate work function for the given device type (e.g., N-type or P-type). Thus, while the device 1400 may include abutting active regions (e.g., the first and second cell regions 1404, 1406) of the same type (e.g., N-type or P-type), because of the increased threshold voltage of the SiGe layer 1602 and the SiGe dummy fin 1706, the leakage current at the cell boundary 1411 is significantly reduced. Stated another way, the SiGe layer 1602 and the SiGe dummy fin 1706 serve to improve isolation between the neighboring first and second cell regions 1404, 1406.

The semiconductor device 1400 may undergo further processing to form various features and regions known in the art. For example, subsequent processing may form a gate stack, sidewall spacers, source/drain regions, various contacts/vias/lines and multilayers interconnect features (e.g., metal layers and interlayer dielectrics) on the substrate 1402, configured to connect the various features to form a functional circuit that may include one or more FinFET devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 1300, and some process steps described above may be replaced or eliminated in accordance with various embodiments of the method 1300.

The various embodiments described herein offer several advantages over the existing art. It will be understood that not all advantages have been necessarily discussed herein, no particular advantage is required for all embodiments, and other embodiments may offer different advantages. For example, embodiments discussed herein include methods and structures for mitigating leakage current in devices that include a continuous active region. In various embodiments, isolation between neighboring cells and thus isolation between abutting active regions is improved by increasing a threshold voltage at the cell boundary. In some embodiments, the threshold voltage at the cell boundary is increased by changing a photomask logic operation (LOP) to reverse a threshold voltage type at the cell boundary (e.g., from N-type to P-type, or from P-type to N-type). In some examples, such threshold voltage reversal, or adjustment in general, may be performed by adjustment of the work function metal and/or a gate dielectric layer. Alternatively, in some cases, the threshold voltage at the cell boundary is increased by performing a threshold voltage implant (e.g., an ion implant) at the cell boundary, and into the dummy gate disposed at the cell boundary. Further, in some embodiments, the threshold voltage at the cell boundary is increased by use of a silicon germanium (SiGe) channel at the cell boundary. In some cases, the SiGe may be disposed within the substrate at the cell boundary and/or the SiGe may be part of the dummy gate disposed at the cell boundary. Therefore, embodiments of the present disclosure provide for improved isolation, and thus decreased leakage current, between neighboring cells having abutting active regions.

Thus, one of the embodiments of the present disclosure described a method comprising providing a substrate including a first active region and a second active region that abuts the first active region at a boundary. In some examples, a first fin is formed within the first active region, a second fin is formed within the second active region, and a dummy fin is formed at the boundary. In some embodiments, a first gate layer of a plurality of gate layers is deposited over the first fin, the second fin, and the dummy fin. By way of example, a first photoresist layer is deposited over the first gate layer and a first opening is patterned within the first photoresist layer using a first mask. In various cases, the first opening exposes a portion of the first gate layer over at least one of the first fin, the second fin, and the dummy fin. In some embodiments, the exposed portion of the first gate layer is removed using an etching process to form a patterned first gate layer.

In another of the embodiments, discussed is a method comprising providing a substrate including a first active region and a second active region that abuts the first active region at a boundary. In some embodiments, a first fin is formed within the first active region, a second fin is formed within the second active region, and a dummy fin is formed at the boundary. In various examples, a photoresist layer is deposited and patterned to expose the dummy fin while the first fin and the second fin remain covered by the patterned photoresist layer. In some cases, a threshold voltage implant is performed into the dummy fin to provide an ion-implanted dummy fin. In some embodiments, a gate stack is formed over the first fin, the second fin, and the ion-implanted dummy fin.

In yet another of the embodiments, discussed is a method comprising providing a substrate including a first cell region and a second cell region that abuts the first cell region at a cell boundary. In some embodiments, a recess is formed within the substrate at the cell boundary. In some examples, a silicon germanium (SiGe) layer is deposited within the recess at the cell boundary. In various cases, a first active fin is formed within the substrate and within the first cell region, a second active fin is formed within the substrate and within the second cell region, and a dummy fin is formed within the SiGe layer along the cell boundary. In some embodiments, a gate stack is formed over the first active fin, the second active fin, and the dummy fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   a continuous active region having neighboring cells;
   a first fin disposed in a first cell of the neighboring cells, the first fin having a first threshold voltage polarity;
   a second fin disposed in a second cell of the neighboring cells, the second fin having the first threshold voltage polarity; and
   a third fin disposed at a cell boundary between the neighboring cells, the third fin having a second threshold voltage polarity different than the first threshold voltage polarity;
   wherein threshold voltages of the first fin and the second fin are different.

2. The device of claim 1, wherein the neighboring cells both include N-type cells.

3. The device of claim 1, wherein the neighboring cells both include P-type cells.

4. The device of claim 1, wherein the first threshold voltage polarity includes an N-type threshold voltage, and wherein the second threshold voltage polarity includes a P-type threshold voltage.

5. The device of claim 1, wherein the first threshold voltage polarity includes a P-type threshold voltage, and wherein the second threshold voltage polarity includes an N-type threshold voltage.

6. The device of claim 1, wherein the first threshold voltage polarity includes an N-type threshold voltage.

7. The device of claim 1, wherein the first threshold voltage polarity includes a P-type threshold voltage.

8. The device of claim 1, further comprising a gate stack disposed over the first fin, the second fin, and the third fin, wherein the gate stack includes at least one gate layer formed over two or less of the first fin, the second fin, and the third fin.

9. The device of claim 8, wherein the at least one gate layer includes a P-type work function metal (PWFM) layer.

10. The device of claim 8, wherein the at least one gate layer includes TiN, TaN, or a combination thereof.

11. A device, comprising:
    a first fin having a first dopant type disposed within a first active region;
    a second fin having the first dopant type disposed within a second active region, the first active region and the second active region defining a continuous active region; and
    a third fin at a boundary between the first active region and the second active region, wherein the third fin is not intentionally part of a circuit current flow path, and wherein the third fin has a second dopant type different than the first dopant type;
    wherein the third fin has a threshold voltage greater than that of either the first fin or the second fin.

12. The device of claim 11, wherein the first active region and the second active region include a same type of active region.

13. The device of claim 12, wherein the same type of active region includes an N-type active region or a P-type active region.

14. The device of claim 11, wherein the first dopant type includes an N-type dopant, and wherein the second dopant type includes a P-type dopant.

15. The device of claim 11, wherein the first dopant type includes a P-type dopant, and wherein the second dopant type includes an N-type dopant.

16. The device of claim 11, wherein the threshold voltage of the third fin is more than 70 mV greater than that of either the first fin or the second fin.

17. A device, comprising:
    a first silicon (Si) region;
    a second Si region adjacent to the first Si region; and
    a silicon germanium (SiGe) region interposing the first Si region and the second Si region, the SiGe region having a width equal to a gate pitch, and the SiGe region electrically isolating the first Si region from the second Si region;
    wherein a first device structure formed within the SiGe region has a greater threshold voltage than a second device structure formed within either the first Si region or the second Si region.

18. The device of claim 17, wherein the first Si region and the second Si region both include an N-type region.

19. The device of claim 17, wherein the first device structure includes a dummy fin, and wherein the second device structure includes an active fin.

20. The device of claim 19, wherein the dummy fin includes a material other than SiGe.

* * * * *